(12) United States Patent
Tarabbia

(10) Patent No.: US 12,704,056 B2
(45) Date of Patent: Aug. 11, 2026

(54) VALIDATION OF THE EFFECTIVENESS OF FACIES PREDICTION METHODS USED FOR GEOLOGICAL MODELS

(71) Applicant: SAUDI ARABIAN OIL COMPANY, Dhahran (SA)

(72) Inventor: Paul Joseph Tarabbia, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 1002 days.

(21) Appl. No.: 17/932,253

(22) Filed: Sep. 14, 2022

(65) Prior Publication Data

US 2024/0084688 A1 Mar. 14, 2024

(51) Int. Cl.

| | |
|---|---|
| ***E21B 44/00*** | (2006.01) |
| ***E21B 47/022*** | (2012.01) |
| ***G01V 11/00*** | (2006.01) |
| ***G06F 30/27*** | (2020.01) |

(52) U.S. Cl.

CPC ............ *E21B 44/00* (2013.01); *E21B 47/022* (2013.01); *G01V 11/00* (2013.01); *G06F 30/27* (2020.01); *E21B 2200/20* (2020.05)

(58) Field of Classification Search

CPC .... E21B 44/00; E21B 47/022; E21B 2200/20; G01V 11/00; G06F 30/27

See application file for complete search history.

(56) References Cited

U.S. PATENT DOCUMENTS

| | | | | |
|---|---|---|---|---|
| 7,970,593 | B2 | 6/2011 | Roggero et al. | |
| 8,330,460 | B2 | 12/2012 | Romero | |
| 9,081,117 | B2 | 7/2015 | Wu et al. | |
| 10,324,229 | B2 | 6/2019 | Theologou et al. | |
| 10,400,590 | B1 * | 9/2019 | Aldred | E21B 49/00 |

(Continued)

OTHER PUBLICATIONS

N.Al-Bulushi et al., "Development of artificial neural network models for predicting water saturation and fluid distribution," Journal of Petroleum Science and Engineering 68 (2009) 197-208. (Year: 2009).*

(Continued)

*Primary Examiner* — Andre Pierre Louis
*Assistant Examiner* — Yi Hao
(74) *Attorney, Agent, or Firm* — Osha Bergman Watanabe & Burton LLP

(57) ABSTRACT

Methods and systems for updating a geological model of a subsurface region are disclosed. The method includes obtaining a first non-nuclear magnetic resonance (NMR) well log and a core sample from a first wellbore, and determining a hydrocarbon pore volume (HcPV) prediction method. The method also includes obtaining, from a second wellbore, a second non-NMR well log and an NMR log, determining a measured HcPV based on the NMR well log, and predicting the predicted HcPV using the second non-NMR well log and the HcPV prediction method. The method further includes determining a calibrated HcPV prediction method based on the predicted HcPV, wherein the calibrated HcPV prediction method comprises a calibrated facies prediction method, obtaining a third non-NMR well log from a third wellbore, predicting a calibrated facies using the third non-NMR well log and the calibrated facies prediction method, and updating the geological model based on the calibrated facies.

20 Claims, 12 Drawing Sheets

(56) References Cited

U.S. PATENT DOCUMENTS

| | | | | |
|---|---|---|---|---|
| 10,466,386 | B2 | 11/2019 | Hurley | |
| 2008/0243447 | A1* | 10/2008 | Roggero | G01V 11/00 703/1 |
| 2010/0010745 | A1* | 1/2010 | Thorne | G01V 11/00 702/179 |
| 2016/0124115 | A1* | 5/2016 | Theologou | G01V 20/00 702/11 |
| 2016/0187532 | A1* | 6/2016 | Hurley | E21B 25/00 702/12 |
| 2018/0258763 | A1* | 9/2018 | King, Jr. | G01R 33/305 |

OTHER PUBLICATIONS

J.J.M. Buiting "Upscaling Saturation-Height Technology for Arab Carbonates for Improved Transition-Zone Characterization," SPE Res Eval & Eng 14 (01): 11-24. (Year: 2010).*

Buiting, J.J.M., "Upscaling Saturation-Height Technology for Arab Carbonates for Improved Transition-Zone Characterization", SPE 125492, SPE Res Eval & Eng, 2011 (14 pages).

Harrison B. et al., "Saturation Heights Methods and Their Impact on Volumetric Hydrocarbon in Place Estimates," SPE 71326, 2001 (12 pages).

Wiltgen N. et al., "Methods of Saturation Modeling Using Capillary Pressure Averaging and Pseudos", SPWLA 44th Logging Symposium, Jun. 22-25, 2003 (10 pages).

Gallegos et al., "A NMR Technique for the Analysis of Pore Structure: Determination of Continuous Pore Size Distributions", Journal of Colloid and Interface Science, vol. 122, No. 1, pp. 143-153, 1988 (13 pages).

Herrick, R. C. et al., "An Improved Nuclear Magnetism Logging System and its Application to Formation Evaluation," SPE 8361, Society of Petroleum Engineers, 1979 (8 pages).

Lian P.Q. et al., "Saturation modeling in a carbonate reservoir using capillary pressure based saturation height function: a case study of the Svk reservoir in the Y Field", Journal of Petroleum Exploration and Production Technology, 2015 (12 pages).

Jacques A.G., "Petrophysical input to simulation: Derive rock type maps from logs water saturations and capillary pressure data", SPWLA 38th Annual Logging Symposium, Jun. 15-18, 1997 (14 pages).

Neuman et al., "Applications of Nuclear Magnetism Logging to Formation Evaluation", Journal of Petroleum Technology, vol. 34, pp. 2853-2862, 1982 (10 pages).

Clerke, E.A. et al., "Wireline Spectral Porosity Analysis of the Arab Limestone-From Rosetta Stone to Cipher", SPWLA 55th Annual Logging Symposium, May 18-22, 2014, Abu Dhabi, UAE, SPWLA-2014-D, pp. 1-23 (24 pages).

Flolo L.H., "Getting the Hydrocarbon Volumes Right—a Quantitative Use of NMR Data in Water Saturation Modelling", SPWLA 39th Annual Logging Symposium, May 26-29, 1998 (13 pages).

Xiao, L. et al., "A new methodology of constructing pseudo capillary pressure (Pc) curves from nuclear magnetic resonance (NMR) logs", Journal of Petroleum Science and Engineering, vol. 147, pp. 154-167, 2016 (14 pages).

Al Harbi, Ahmad et al., "A New NMR-Based Height Saturation Model of a Low Permeability Carbonate Reservoir", SPE, Paper No. SPE-192612-MS, 2018 (17 pages).

Gao, Bo et al., "New Method for Predicting Capillary Pressure Curves from NMR Data in Carbonate Rocks", SPWLA 62nd Annual Logging Symposium, May 14-18, 2011 (12 pages).

Jackson, Jasper A., "Nuclear Magnetic Resonance Well Logging", The Log Analyst 25, 1984 (15 pages).

* cited by examiner 300
302
304
306
308
310
312
314
316
318

800

VALIDATION OF THE EFFECTIVENESS OF FACIES PREDICTION METHODS USED FOR GEOLOGICAL MODELS

BACKGROUND

Oil and gas extraction from subsurface rock formations requires the drilling of wells using drilling rigs mounted on the ground or on offshore rig platforms. Once drilled, the wells access the hydrocarbon reservoirs. Reservoir characterization, such as assessments of reservoir quality, models of subterranean regions of interest, and well-site planning, among other things, may be conducted using the outputs of geological modeling.

Geological modeling is increasingly essential in the petroleum industry as a method to represent hydrocarbon reservoir geology in three-dimensional numerical form. The generation of these three-dimensional representations of the subsurface geology is achieved by incorporating a plurality of source data across a number of petroleum disciplines. Geological modeling of particular hydrocarbon reservoir regions, "static reservoir modeling," is often used as a method of predicting original oil in place volumes and distributing parameters such as porosity (Ø), permeability (κ) and water saturation ($s_w$). Reservoir simulation, "dynamic reservoir modeling," is used to predict the behavior of fluids under various hydrocarbon recovery scenarios, allowing reservoir engineers to understand which recovery options offer the safest and most economic hydrocarbon recovery plan for a given reservoir. Reservoir quality, among other things, reflects the hydrocarbon storage capacity, the hydrocarbon deliverability, and the heterogeneity of the reservoir. Identification of hydrocarbon bearing reservoir locations and the accurate estimation of reservoir quality is critical for exploration, development and production in the oil and gas fields.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments disclosed herein relate to methods for updating a geological model of a subsurface region. The methods include obtaining a first plurality of well logs and a core sample from a first wellbore penetrating the subsurface region, where the first plurality of well logs includes a first non-nuclear magnetic resonance (NMR) well log, determining an interpreted facies and a capillary pressure curve from the core sample, and determining a hydrocarbon pore volume (HcPV) prediction method based, at least in part, on the first plurality of well logs and the capillary pressure curve, where the HcPV prediction method predicts a predicted HcPV, a predicted facies, and a developed saturation height function (SHF). The methods also include obtaining a second plurality of well logs from a second wellbore penetrating the subsurface region, where the second plurality of well logs includes an NMR well log and a second non-NMR well log, determining a measured HcPV based, at least in part, on the NMR well log, predicting the predicted HcPV using the second non-NMR well log and the HcPV prediction method, and defining a stopping criterion, where the stopping criterion is based, at least in part, on a similarity of the measured HcPV and the predicted HcPV. The methods further include iteratively, or recursively, until the stopping criterion is met, and updating the HcPV prediction method based, at least in part, on a dissimilarity of the measured HcPV and the predicted HcPV, and updating the predicted HcPV using the updated HcPV prediction method. The methods still further include determining a calibrated HcPV prediction method based, at least in part, on the predicted HcPV that satisfies the stopping criterion, where the calibrated HcPV prediction method includes a calibrated facies prediction method, and a calibrated SHF prediction method, obtaining a third plurality of well logs for a third wellbore penetrating the subsurface region, where the third plurality of well logs includes a third non-NMR well log, predicting a calibrated facies using the third plurality of well logs and the calibrated facies prediction method; and updating the geological model based, at least in part, on the calibrated facies.

In general, in one aspect, embodiments disclosed herein relate to a non-transitory computer readable medium storing a set of instructions, executable by a computer processor, the set of for updating a geological model of a subsurface region including steps for receiving a first plurality of well logs and a core sample dataset from a first wellbore penetrating the subsurface region, where the first plurality of well logs includes a first non-nuclear magnetic resonance (NMR) well log, determining an interpreted facies and a capillary pressure curve from the core sample dataset, determining a hydrocarbon pore volume (HcPV) prediction method based, at least in part, on the first plurality of well logs and the capillary pressure curve, where the HcPV prediction method predicts a predicted HcPV, a predicted facies, and a developed saturation height function (SHF). The functionality also including steps for receiving a second plurality of well logs from a second wellbore penetrating the subsurface region, where the second plurality of well logs includes an NMR well log and a second non-NMR well log, determining a measured HcPV based, at least in part, on the NMR well log, predicting the predicted HcPV using the second non-NMR well log and the HcPV prediction method, and defining a stopping criterion, where the stopping criterion is based, at least in part, on a similarity of the measured HcPV and the predicted HcPV. The set of instructions further including steps for iteratively, or recursively, until the stopping criterion is met, updating the HcPV prediction method based, at least in part, on a dissimilarity of the measured HcPV and the predicted HcPV, and updating the predicted HcPV using the updated HcPV prediction method. The set of instruction further still including steps for determining a calibrated HcPV prediction method based, at least in part, on the predicted HcPV that satisfies the stopping criterion, where the calibrated HcPV prediction method includes a calibrated facies prediction method, and a calibrated SHF prediction method, receiving a third plurality of well logs for a third wellbore penetrating the subsurface region, where the third plurality of well logs includes a third non-NMR well log, predicting a calibrated facies using the third plurality of well logs and the calibrated facies prediction method and updating the geological model based, at least in part, on the calibrated facies.

In general, in one aspect, embodiments disclosed herein relate to a system for updating a geological model of a subsurface region. The system includes a well logging system configured to record a first plurality of well logs from a first wellbore penetrating the subsurface region, where the first plurality of well logs includes a first non-nuclear magnetic resonance (NMR) well log, a second plurality of well logs from a second wellbore penetrating the subsurface region, where the second plurality of well logs includes an NMR well log and a second non-NMR well log, and a third plurality of well logs for a third wellbore penetrating the subsurface region, where the third plurality of well logs includes a third non-NMR well log. The system also includes a well coring system equipped to extract a core sample from the first wellbore. The system further includes a computer processor configured to determine an interpreted facies and a capillary pressure curve from the core sample, determine a hydrocarbon pore volume (HcPV) prediction method based, at least in part, on the first plurality of well logs and the capillary pressure curve, where the HcPV prediction method predicts a predicted HcPV, a predicted facies, and a developed saturation height function (SHF). The computer processor is also configured to determine a measured HcPV based, at least in part, on the NMR well log, predict the predicted HcPV using the second non-NMR well log and the HcPV prediction method, define a stopping criterion, where the stopping criterion is based, at least in part, on a similarity of the measured HcPV and the predicted HcPV. The computer processor is further configured to iteratively, or recursively, until the stopping criterion is met, update the HcPV prediction method based, at least in part, on a dissimilarity of the measured HcPV and the predicted HcPV, and update the predicted HcPV using the updated HcPV prediction method. The computer processor is further still configured to determine a calibrated HcPV prediction method based, at least in part, on the predicted HcPV that satisfies the stopping criterion, where the calibrated HcPV prediction method comprises a calibrated facies prediction method, and a calibrated SHF prediction method, predict a calibrated facies using the third plurality of well logs and the calibrated facies prediction method, and update the geological model based, at least in part, on the calibrated facies.

Other aspects and advantages of the claimed subject matter will be apparent from the following description and the appended claims.

DETAILED DESCRIPTION

Figure 1:
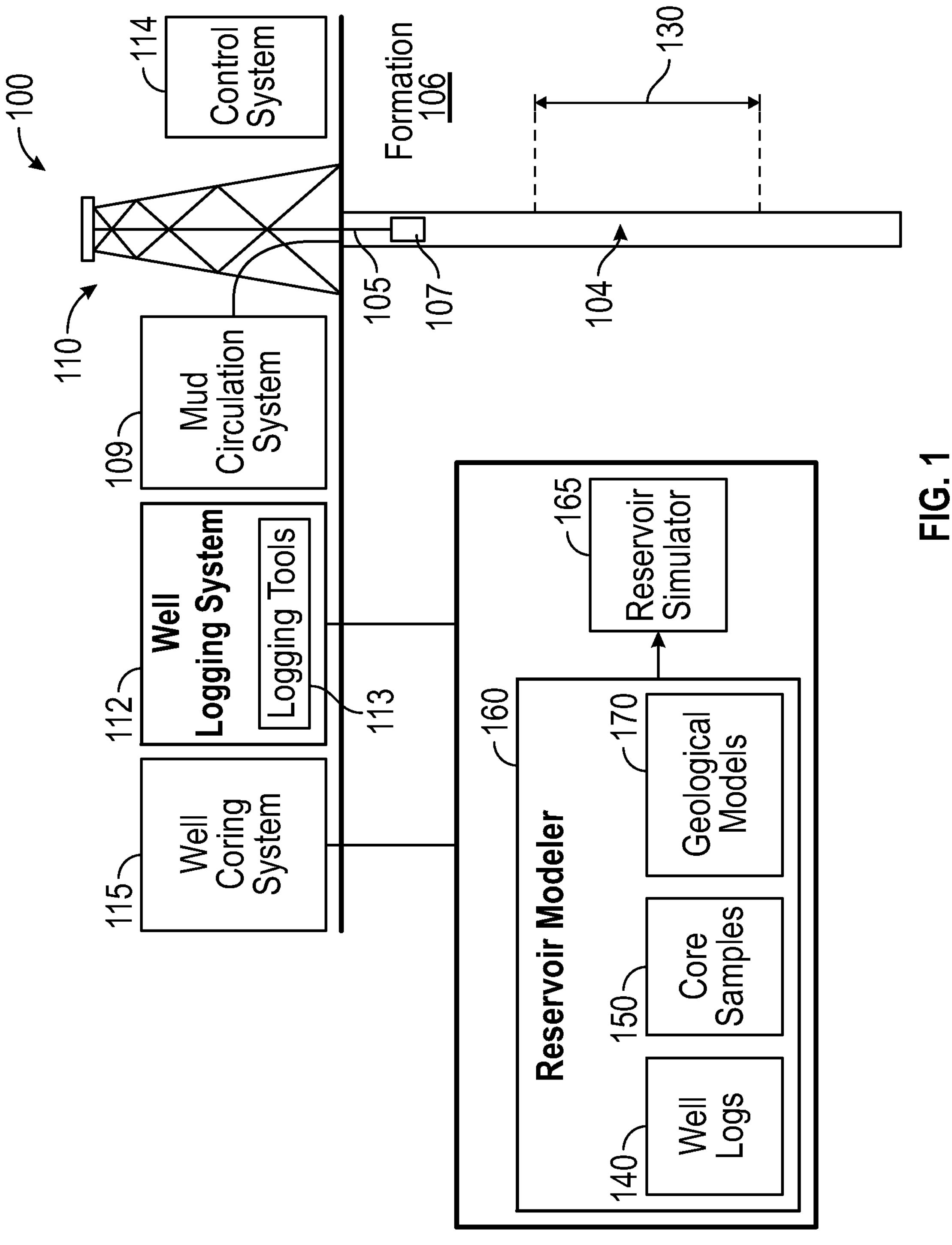
FIG. 1 depicts a well site in accordance with one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-11 any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include references to their plural forms unless the context clearly dictates otherwise. Thus, for example, reference to "a capillary pressure curve" includes reference to one or more of such capillary pressure curves.

Terms such as "approximately," "substantially," etc., mean that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

It is to be understood that one or more of the steps shown in flowcharts may be omitted, repeated, and/or performed in a different order than the order shown. Accordingly, the scope disclosed herein should not be considered limited to the specific arrangement of steps shown in the flowcharts.

Although multiple dependent claims may not be introduced, it would be apparent to one of ordinary skill that the subject matter of the dependent claims directed to one or more embodiments may be combined with other dependent claims.

Geological modeling may incorporate a number of source datasets, including facies interpretations. Facies interpretations (and information derived from the interpretations) are important aspects of understanding a hydrocarbon reservoir and are commonly derived from subsurface whole-core samples extracted from wells. Facies prediction methods use accepted facies interpretations developed in cored wells to predict facies in un-cored wells using various techniques, including machine learning (ML) or artificial intelligence (AI). Validating the effectiveness of facies predictions in un-cored wells is challenging. It may be laborious to validate the predictions manually and current automated methods for the quality control of predicted facies have their disadvantages or may not be straight-forward.

Accordingly, there exists a need for the quantifiable quality control of information, such as facies interpretations, used to populate geological models. Disclosed are methods that, in some embodiments, add a more robust layer of quality control to the facies prediction process for un-cored wells having nuclear magnetic resonance log data. The methods, in some embodiments, may increase the number of wells with accurate facies information, which may then be used to populate geological models used in reservoir simulation. Furthermore, methods are disclosed for determining and drilling well paths based on the reservoir simulation.

FIG. 1 depicts a well site (100), in accordance with one or more embodiments, that may include a well having a wellbore (104) extending into a formation (106). The wellbore (104) may include a bored hole that extends from the surface into a target zone of the formation (106), such as a reservoir (not shown). The formation (106) may possess various formation characteristics of interest, such as formation porosity, formation permeability, and water saturation. Porosity may indicate how much void space exists in a particular rock within an area of interest in the formation (106), where oil, gas and water may be trapped. Permeability may indicate the ability of liquids and gases to flow through the rock within the area of interest. Water saturation may indicate the fraction of water in a given pore space within hydrocarbon reservoirs.

In accordance with one or more embodiments, the well site (100) may include a drilling system (110), a well logging system (112), a well coring system (115), a control system (114). The drilling system (110) may include a drillstring (105), a drill bit (107), a mud circulation system (109) and/or the like for use in boring the wellbore (104) into the formation (106). The control system (114) may include hardware and/or software for managing drilling operations and/or maintenance operations. For example, the control system (114) may include one or more programmable logic controllers (PLCs) that include hardware and/or software with functionality to control one or more processes performed by the drilling system (110). Specifically, a programmable logic controller may control valve states, fluid levels, pipe pressures, warning alarms, and/or pressure releases throughout a drilling rig. In particular, a programmable logic controller may be a ruggedized computer system with functionality to withstand vibrations, extreme temperatures, wet conditions, and/or dusty conditions, for example, around a drilling rig. Without loss of generality, the term "control system" may refer to a drilling operation control system that is used to operate and control the equipment, a drilling data acquisition and monitoring system that is used to acquire drilling process and equipment data and to monitor the operation of the drilling process, or a drilling interpretation software system that is used to analyze and understand drilling events and progress.

The well logging system (112) may include one or more logging tools (113), such as a nuclear magnetic resonance (NMR) logging tool or a resistivity logging tool, for use in generating well logs (140) of the formation (106). For example, a logging tool may be lowered into the wellbore (104) to acquire measurements as the tool traverses a depth interval (130) (for example, targeted reservoir section) of the wellbore (104). The plot of the logging measurements versus depth may be referred to as a "log" or "well log." Well logs (140) may provide at particular depth measurements within a well properties that describe such reservoir characteristics as formation porosity, resistivity, and the like. The resulting logging measurements may be stored or processed or both, for example, by the well logging system (112), to generate corresponding well logs (140) for the well. A well log may include, for example, a series of measurements of a logging tool which is reference in measured depth for a depth interval (130) of the wellbore (104). Some measurements of the formation can be taken while drilling (logging while drilling or "LWD") which are referenced in time and then converted to depth using the Control system (114). Furthermore, the well logging system (112) may determine other geological data for the well by changing the measurement type of corresponding well logs (140) for the well.

In accordance with one or more embodiments, multiple types of logging techniques are available for determining various reservoir characteristics, and a particular form of logging may be selected and used based on the logging conditions and the type of desired measurements. NMR logging measures the induced magnetic moment of hydrogen nuclei (specifically protons) contained within the fluid-filled pore space of porous media (for example, reservoir rocks). Thus, NMR logs may measure the magnetic response of fluids present in the pore spaces of the reservoir rocks. In so doing, NMR logs measure a number of pore sizes which can be used to indicate porosity as well as the types of fluids present in the pore spaces.

NMR measurements may use a T2 cut-off value (which may be referred to as a "T2c value" or a "T2 cut-off value") in order to divide effective porosity into movable and irreducible fluid saturations. A T2 cut-off value may be the maximum T2 signal amplitude for a portion of porosity that is occupied by immovable fluids. Accordingly, the T2 cut-off value may distinguish free fluid volume (FFV) from non-movable fluid or bound fluid volume (BFV) in a geological region or core sample (150). In a T2 distribution, a bulk volume irreducible of water (BVI) value may include T2 amplitudes in the spectrum having T2 values less than the T2 cut-off value. In other words, a T2 cut-off value may be the sum of porosities whose T2 amplitude is less than the T2 cut-off value, and consequently a free fluid index (FFI) value may be the sum of T2 amplitudes that are greater than the T2 cut-off value. T2 signal values above the T2 cut-off value may indicate large pores that are potentially capable of production, whereas T2 signal values below the T2 cut-off value may indicate small pores containing fluid trapped by capillary pressure. Therefore, the T2 cut-off value may be used to analyze the ratio of irreducible fluid and movable fluid in porous rock.

Various reservoir parameters may be determined by analyzing NMR data, such as T2 signal data. HPV can be computed using the FFI. An FFI value may be the difference between total porosity and the BVI value. BVI values may correspond to the immovable or bound water in a formation, such as a capillary bound water. Thus, BVI may be a function of the pore-throat size distribution, where high threshold pressure due to smaller pore throats retains the fluids in the pores.

Reservoir characteristics may also be determined using coring (i.e., physical extraction of rock specimens) to produce core samples (150) for core analyses. Coring operations may physically extract a rock specimen from a region of interest within the wellbore (104) for detailed laboratory analysis. For example, when drilling an oil or gas well, a coring bit may cut core samples (or "cores" or "core specimens" or "core plugs") from the formation (106) and bring the core samples to the surface, and these core specimens may be analyzed at the surface (e.g., in a laboratory) to determine various characteristics of the formation (106) at the location from which the specimen was obtained.

A well coring system (115) may include various tools for collecting core during drilling or after drilling a wellbore (104). Conventional coring may include collecting a cylindrical specimen of rock from the wellbore (104) using a core bit, a core barrel, and a core catcher. The core bit may have a hole through its center axis that allows the core bit to drill around a central cylinder of rock. Subsequently, the resulting core specimen may be acquired by the core bit and retained inside the core barrel. More specifically, the core barrel may include a special storage chamber within a coring tool for holding the core specimen. Furthermore, the core catcher may provide a grip to the bottom of a core and, as tension is applied to the drill string, the rock under the core breaks away from the undrilled formation below coring tool. Thus, the core catcher may retain the core specimen to avoid the core specimen falling through the bottom of the coring string. In some implementations, the core catcher may seal the core to preserve the in-situ pore fluids in the core sample (150).

Turning to the reservoir modeler (160), the reservoir modeler (160) may input a number of data sets into the geological models (170) and would perform these duties using hardware or software with functionality for generating one or more geological models (170) regarding the formation (106). For example, the reservoir modeler (160) may import well log data and further analyze the well log data, in addition to core sample data, seismic data, or other types of data to generate or update the one or more geological models (170) having a complex geological environment. Geological models (170) may include geochemical or geomechanical models that describe structural relationships within a particular geological region.

In some embodiments, the reservoir modeler (160) will utilize a software platform that will allow the import of data acquired from the drilling system (110) and well logging system (112) as inputs (among others), which may include multiple data types from multiple sources. In some embodiments, the reservoir modeler (160) may include a computer system that is similar to the computer (1102) system described below with regard to FIG. 10 and the accompanying description.

In further embodiments, reservoir simulation may be performed by a reservoir simulator using the estimated reservoir properties generated in the static reservoir model of the hydrocarbon reservoir as generated by the reservoir modeler (160). Reservoir simulation may include the prediction of pore fluid pressures throughout the reservoir and wellbore pressure and hydrocarbon production rates at one or more future times based upon the static reservoir model and measurements of wellbore pressure and hydrocarbon production rates at times in the past. The reservoir simulator may solve a set of mathematical equations that represent established laws, such as Darcy's Law, that govern fluid flow in porous, permeable media in order to perform the reservoir simulation. The reservoir simulator (165) may include hardware and/or software with functionality for performing one or more reservoir simulations (dynamic reservoir modelling) regarding the hydrocarbon-bearing formation. In some embodiments, the reservoir modeler (160) and reservoir simulator (165) may be located in a location remote from the well site (100), and may receive information from the well coring system (115) or the well logging system (112). In other embodiments, the reservoir modeler (160) and reservoir simulator (165) may be located at the well site (100).

Figure 2A:
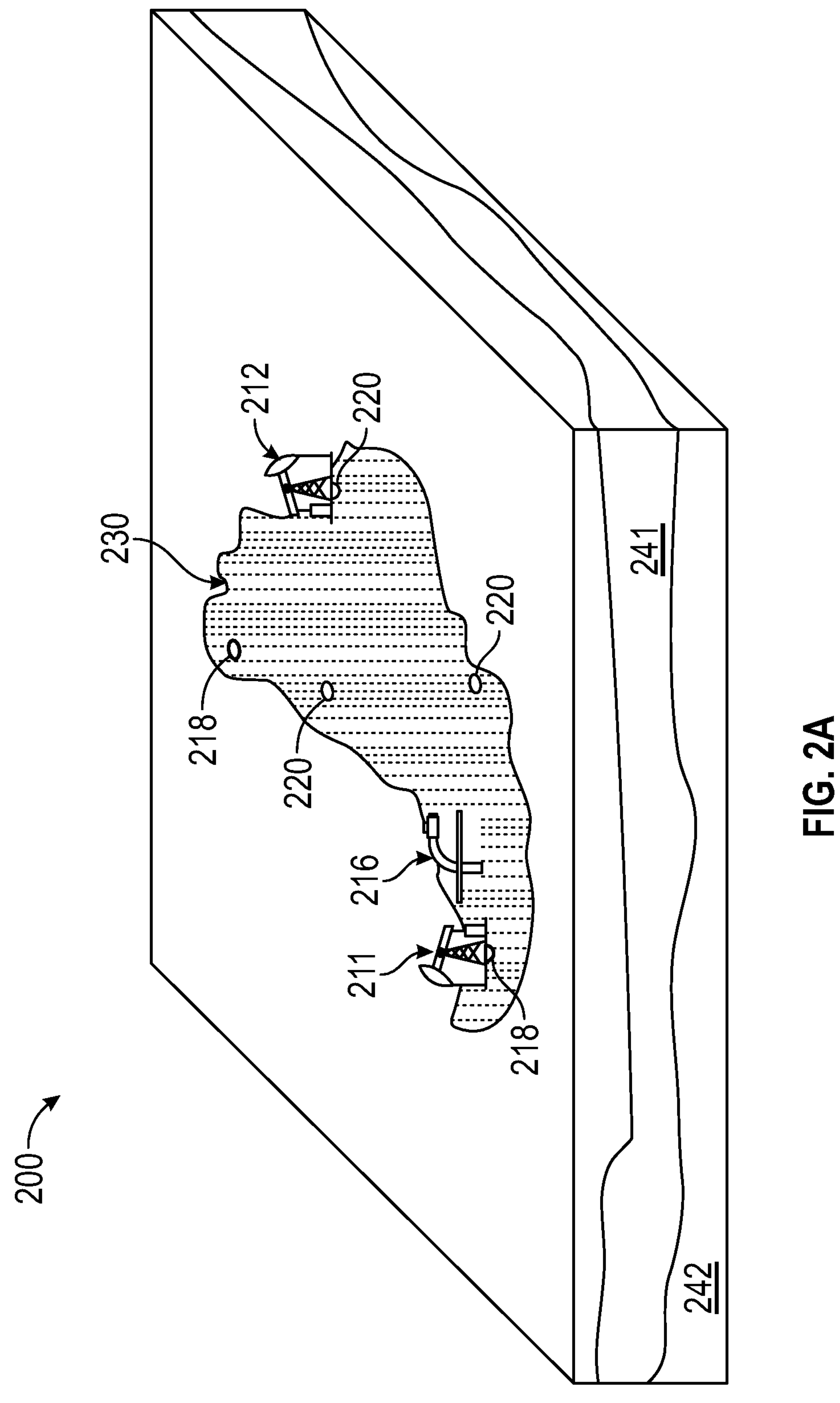
FIG. 2A shows a schematic diagram in accordance with one or more embodiments.

Turning to FIG. 2A, FIG. 2A shows a schematic diagram in accordance with one or more embodiments. As illustrated in FIG. 2A, FIG. 2A shows a geological region (200) that may include one or more reservoir regions (e.g., reservoir region (230)) with various production wells (e.g., production well A (211), production well B (212)). Likewise, a reservoir region may also include one or more injection wells (e.g., injection well C (216)) that include functionality for enhancing production by one or more neighboring production wells. In addition to production wells, the geological region (200) may include exploration wells, appraisal wells, shut-in wells, abandoned wells, and observation wells. Any of these wells may have yielded core samples during or after their drilling. FIG. 2A shows locations of "cored wells" (218), wells from which core samples have been extracted, as well as locations of "un-cored wells" (220), wells without core sample data. Wells may be disposed in the reservoir region (230) penetrating various subsurface layers (e.g., subsurface layer A (241), subsurface layer B (242)), which may include conventional or unconventional hydrocarbon reservoirs. Production data and/or injection data may exist for a particular well, where production data may include data that describes production or production operations at a well, such as fluid properties and compositions of samples taken at the wellhead.

Figure 2B:
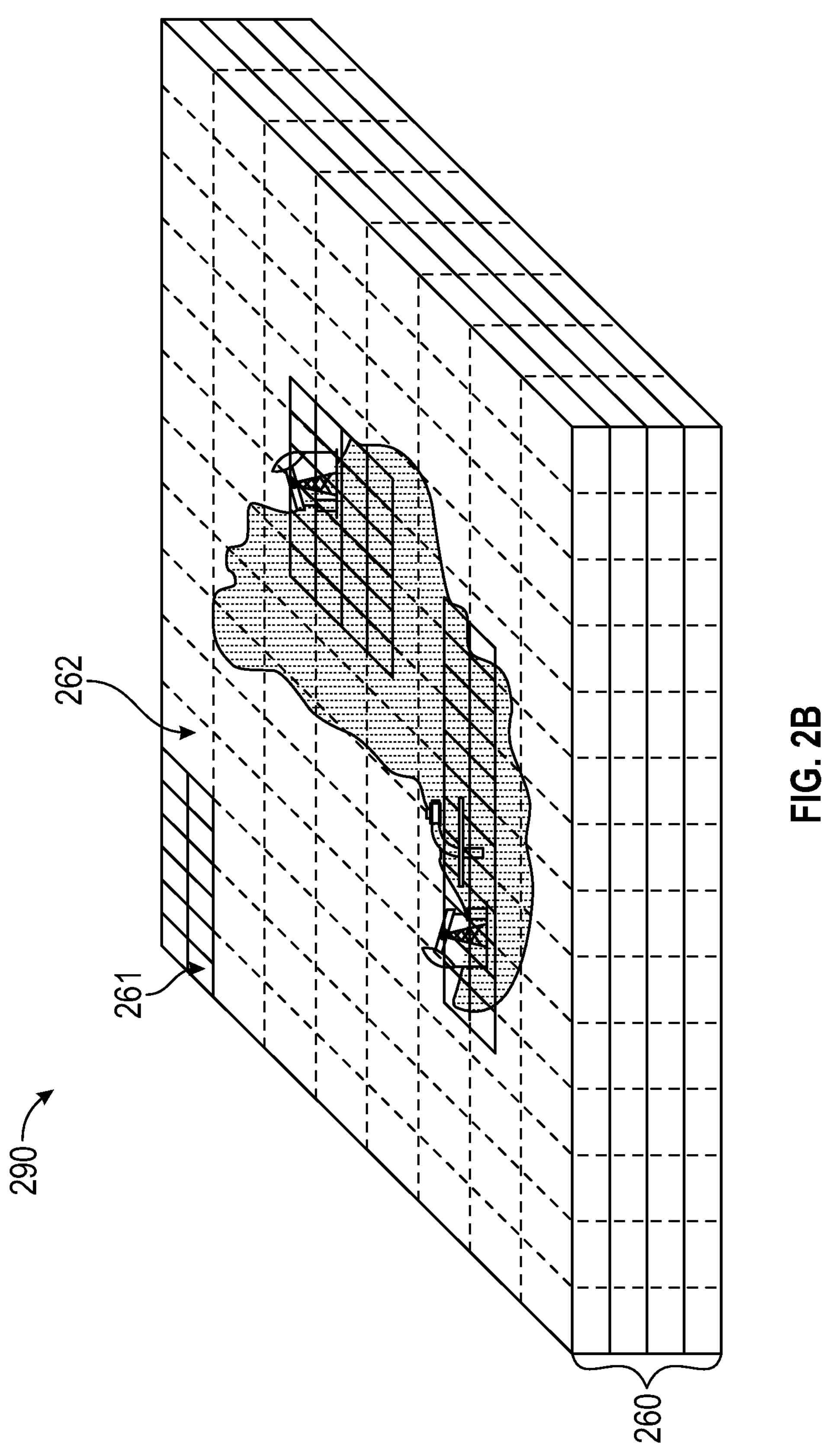
FIG. 2B shows a schematic diagram in accordance with one or more embodiments.

Now turning to FIG. 2B, FIG. 2B shows a schematic diagram in accordance with one or more embodiments. As illustrated in FIG. 2B, FIG. 2B shows a reservoir grid model (290) that corresponds to the geological region (200) from FIG. 2A. More specifically, the reservoir grid model (290) includes grid cells (261) that may refer to an original cell of a reservoir grid model as well as coarse grid blocks (262) that may refer to an amalgamation of original cells of the reservoir grid model. For example, a grid cell may be the case of a 1'×100'×100' block, where coarse grid blocks may be of sizes 2'×200'×200', 4'×400'×400', etc. Both the grid cells (261) and the coarse grid blocks (262) may correspond to columns for multiple model layers (260) within the reservoir grid model (290).

The reservoir grid model may include a plurality of grid cells or blocks, each representing a contiguous volume of the reservoir region (230). Each cell may have a value for each of a number of properties associated with it. For example, various reservoir properties, e.g., permeability, porosity, facies, or saturations (and many others) property values would be associated with a particular grid cell or coarse grid block. In some embodiments, a static reservoir model composed of a number of relevant grids (or multiple reservoir grid models) may be exported to a computer system to perform reservoir simulations.

The reservoir simulator (165) may use a subsurface static model produced by a reservoir modeler (160) that contains a digital description of the physical properties of the rocks as a function of position within the subterranean region and the fluids within the pores of the porous, permeable reservoir rocks at a given time. In some embodiments, the digital description may be in the form of a dense 3D grid with the physical properties of the rocks and fluids defined at each node. In some embodiments, the 3D grid may be a cartesian grid, while in other embodiments the grid may be an irregular grid.

As stated, the static reservoir model may account for, among other things, the hydrocarbon storage capacity of the subsurface formation (106) and fluid transport pathways that will allow the prediction of the production rate of hydrocarbons from a well, or a set of wells, over their lifetime. As such, accurate subsurface models are critical to reduce exploration risks, plan the location of well sites (100), optimize reservoir production, improve reservoir characterization, best leverage existing discoveries, and better extend hydrocarbon recovery from existing wells.

Figure 3:
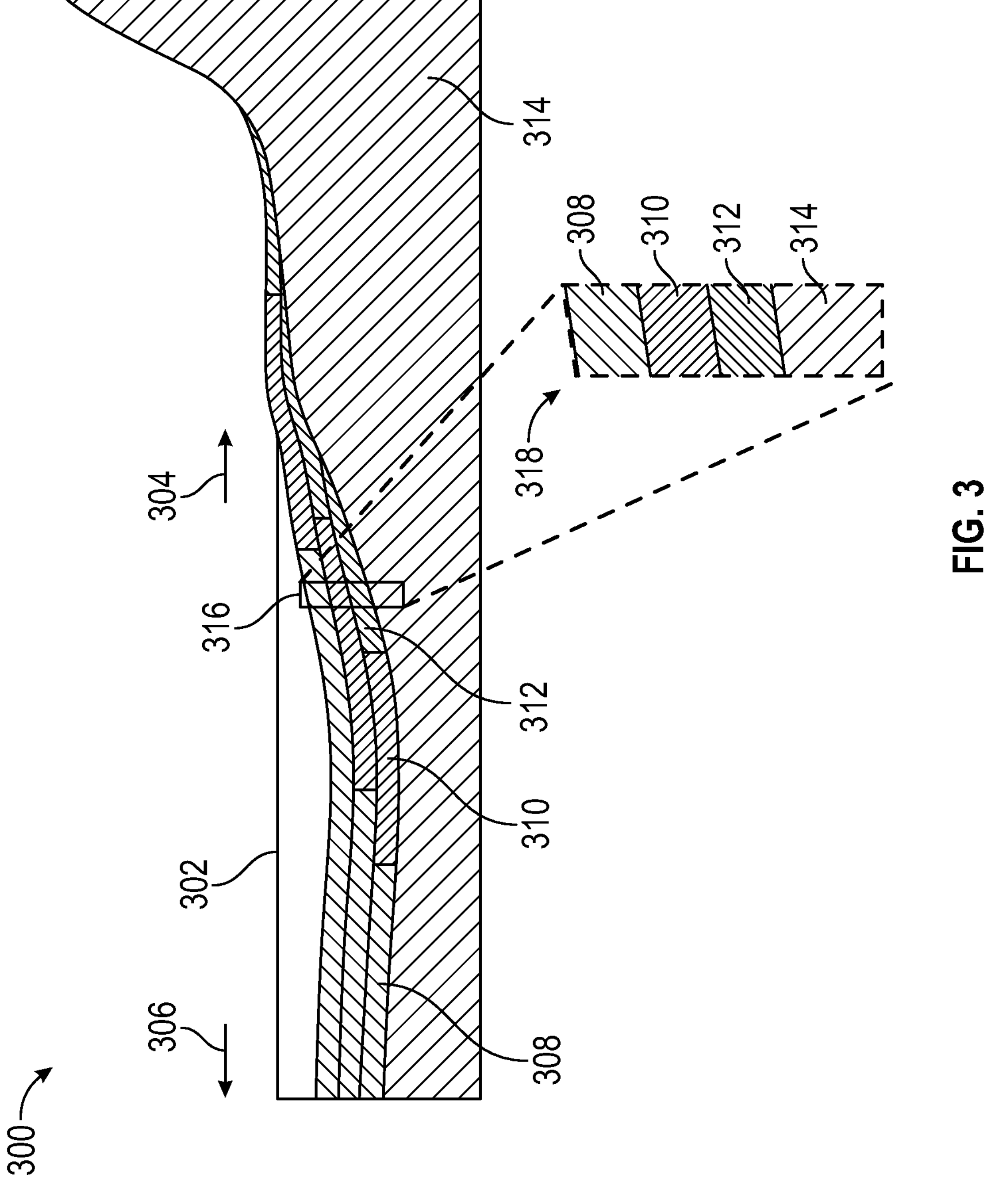
FIG. 3 depicts a depositional environment in accordance with one or more embodiments.

FIG. 3 depicts a depositional environment (300) in accordance with one or more embodiments. A depositional environment (300) is a geographical area in which sediments are deposited by mechanisms such as chemical precipitation, wind, water, or ice in depositional environments include terrestrial or marine. The depositional environment (300) in FIG. 3 includes a sea surface (302) that may extend from the shoreline (304) towards the deep ocean (306), and four distinct rock types, or "rock facies," with overall rock characteristics reflecting their origin and differentiating one facies from others around it.

In accordance with one or more embodiments, rock facies are defined using specified characteristics of a rock sample that can be any observable characteristic of the rock. Rock facies (from hereinafter also "facies") may include rock color, composition, texture, structure, fossil content, association, and form and may be chemical, physical, or biological in nature. Specifically, rock facies may include, without limitation, rock color, grain size and shape, mineral content, or rock type. Rock facies of one body of rock distinguish it from rock facies of another body of rock. Petrophysical properties of rock are defined as physical and chemical properties of rock and the interaction of rock with fluids. Petrophysical properties of rock may include, without limitation, porosity, permeability, and saturation. For static reservoir models, these properties are distributed and then in the dynamic reservoir simulation, these petrophysical properties are typically most important as they impact fluid behavior.

Continuing with FIG. 3, as sea levels change over time, water depth may change and sediment may be carried landward, towards the shoreline (304) or seaward, towards the deep ocean (306), causing facies to shift and overlap one another.

In FIG. 3, the four facies (308, 310, 312, 314) overlap at a core sample location (316), with the extracted core sample (318) shown to contain each of the four facies stacked vertically on top of one another. In some embodiments, core samples (150) extracted from cored wells (218) may be used to classify rock facies within a geological region (200). Rock facies classifications generated from core samples (150) are typically performed through visual interpretation or laboratory analysis and may be used to model the distribution of facies, e.g. derive "facies predictions." That is, rock facies classifications may also be referred to as a facies interpretation. In some embodiments, facies interpretations from core samples may be correlated with well logs within the geological region (200). Correlating well logs with core samples (150) from a particular geological region (200) may be used to predict facies in un-cored wells (220) from the same region.

Facies prediction for un-cored wells (220) can be challenging, particularly where quantitative analysis of numerous well logs by visual observation can be time-consuming and tedious. There exist methods to predict facies for un-cored wells (220) using machine learning or a number of software packages. In some embodiments, machine learning engines may be trained to predict facies from well log data using training datasets including various well logs and core samples from cored wells (218). The trained set may then be used to predict facies from well log data recorded in un-cored wells (220). Machine-learning engines may require user input to train the algorithm, e.g., "supervised-learning algorithms." Supervised learning classification requires "labeled" datasets, which are datasets that have already been classified by a user. A small number of labeled datasets may then be used to train the supervised-learning algorithm, which can then be used to classify large numbers of unlabeled datasets. "Unsupervised-learning algorithms" do not require training data and use machine learning to analyze and cluster unlabeled datasets, i.e., without intervention, or supervision, from the user.

In other embodiments, facies classification methods may include interpretations of 3D seismic data, these may be referred to as "seismic facies classifications," or interpretations of well log data, that may be called "electrofacies classifications." Seismic inversion methods may be used to classify facies, by inverting seismic data volumes into seismic impedance volumes. Seismic impedance relates rock density and seismic velocity, therefore varies among different rock types. The inverted seismic data volumes may also be constrained by geostatistical modeling parameters or well data. Seismic facies classification methods may use artificial neural networks or machine learning to seek relationships between the rock facies and natural structure within the seismic data, incorporating data characteristics such as seismic waveform shape and attribute maps.

Well log information used in electrofacies classification may include standard well log suites, such as gamma ray, resistivity, density, or other logs. Electrofacies classifications may include machine learning techniques such as clustering, which groups data points having similar properties or features. The machine learning techniques used for facies classification may be supervised or unsupervised. In other embodiments, seismic facies classifications may be combined with electrofacies classifications to improve facies predictions.

Figure 4C:
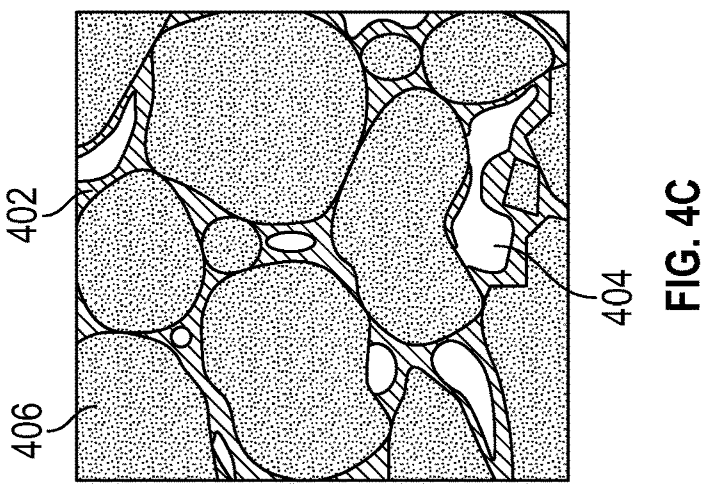
FIGS. 4A-4C show examples of pore saturation in accordance with one or more embodiments.
Figure 4B:
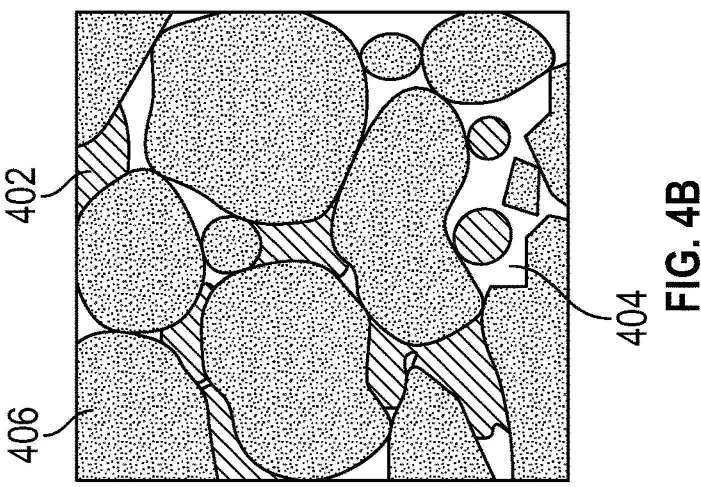
Figure 4A:
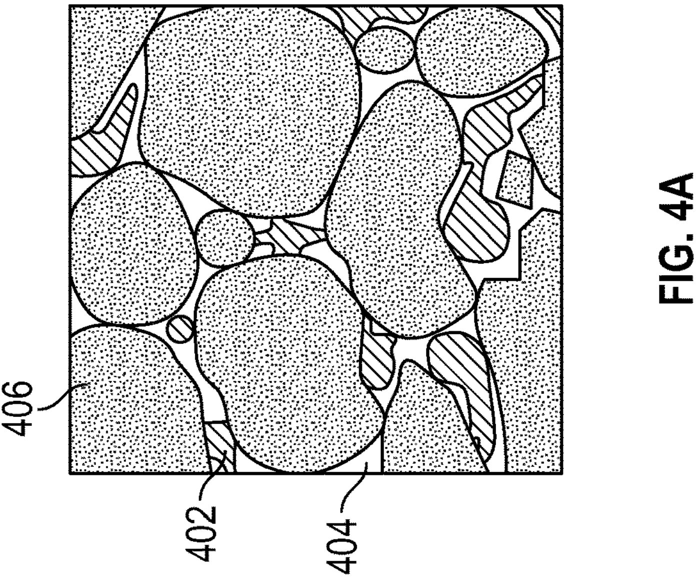

FIGS. 4A-4C show examples of pore saturation in accordance with one or more embodiments. FIGS. 4A-4C are examples of the interaction between rocks and liquids in a reservoir. Wettability is the preference for one fluid, such as water (404) to adhere to a rock surface rather than another immiscible fluid, such as oil (402). Rocks can be "water-wet," "oil-wet," or "intermediate-wet." FIG. 4A depicts a water-wet condition, where the water (404) coats the surface of the pores (406) while oil (402) remains in the center of the largest pores. If the surfaces are oil-wet, as shown in FIG. 4C, the positions of water and oil are reversed; the formation matrix is coated with oil while the water remains in the center of the largest pores. FIG. 4B shows an example of an intermediate-wet condition termed a "mixed-wet" case. In a mixed-wet case there is some tendency for both of the aforementioned situations to occur and may also be related to the relative wettability of the minerals located in the rock.

Wettability is a major influencer of the location, transport and distribution of fluids within a reservoir. Wettability can also affect relative permeability, electrical properties, nuclear magnetic resonance relaxation times, capillary pressure, and water saturation curves. Water saturation may be defined as the fraction of water in a defined pore space and may be expressed as a percentage of the total pore volume.

Figure 5B:
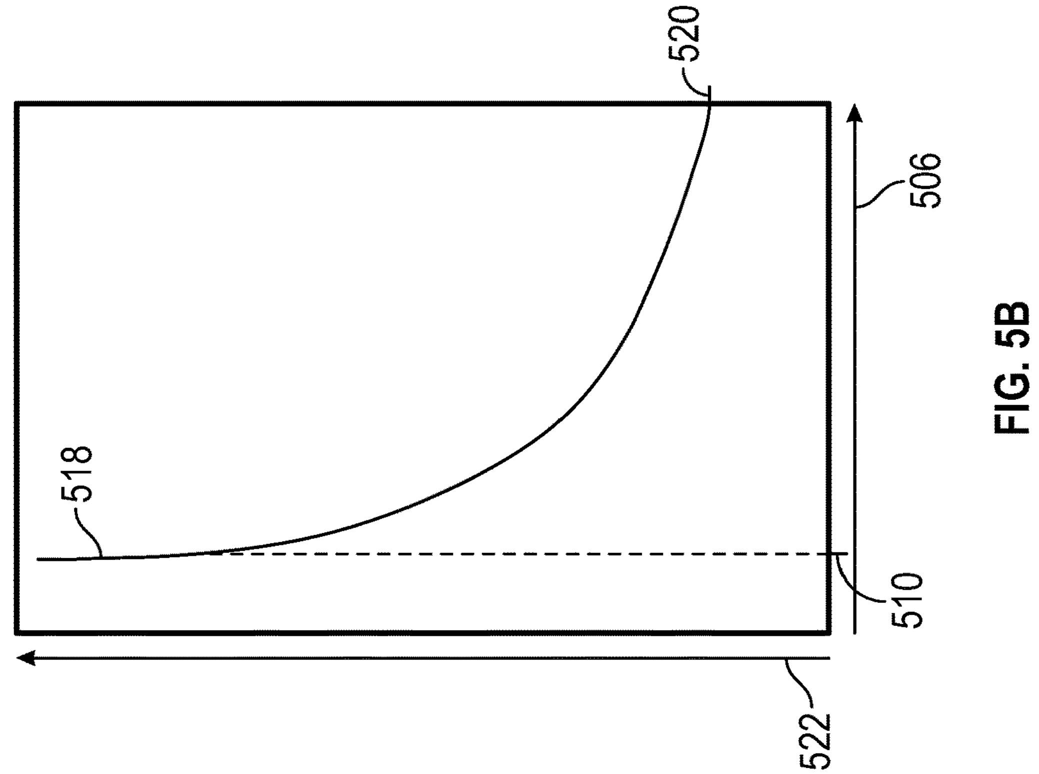
FIG. 5B shows an example of capillary pressure in accordance with one or more embodiments.
Figure 5A:
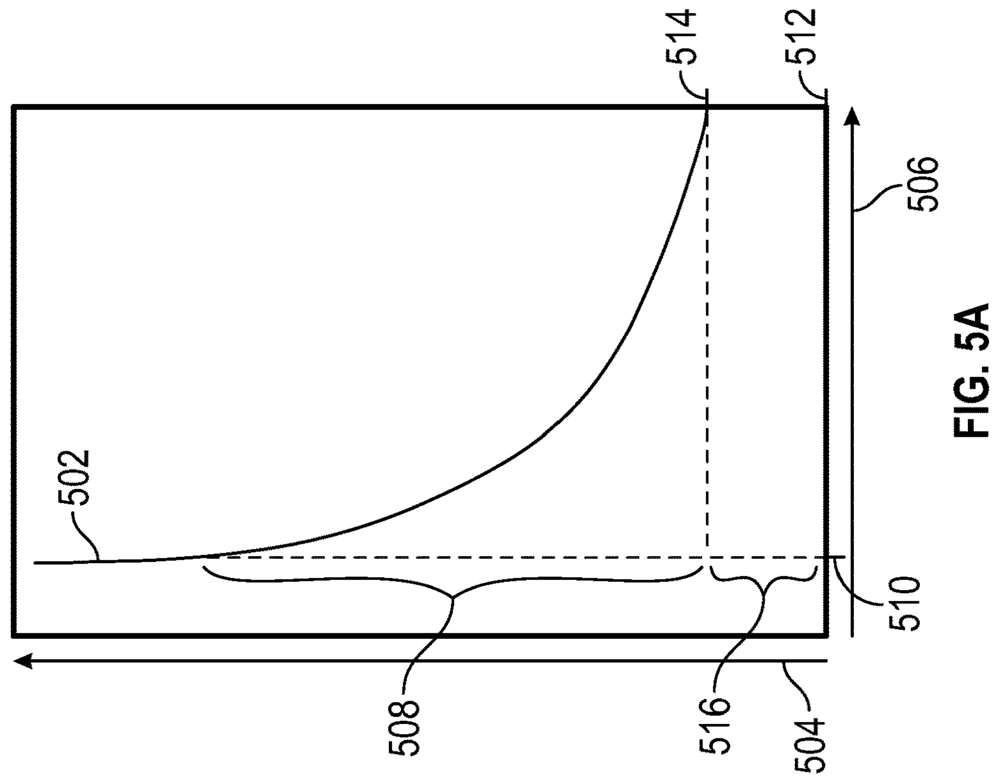
FIG. 5A shows an example of hydrocarbon column saturation in accordance with one or more embodiments.

FIG. 5A shows an example of hydrocarbon column saturation in accordance with one or more embodiments. In particular, the saturation curve (502) in FIG. 5A indicates the amount of water saturation for any given pressure (or height) relating to a water-wet homogeneous reservoir. The vertical axis (504) denotes increasing reservoir height, or height above the free water level (HAFWL), starting from 0 (feet or meters), and the horizontal axis (506) denotes increasing water saturation, ranging from 0 to 100 percent. The transition zone (508) is the range over which the saturation changes from water to oil with increasing height. It lies below the oil zone, where the water saturation is referred to as irreducible, $S_{wirr}$ (510), and extends to the water zone, which is below the free water level (FWL) (512). The saturation curve (502) terminates above the FWL (512), below which only water is produced.

Water and hydrocarbons are coproduced from the transition zone (508), the transition zone (508) terminating when water becomes predominant at the oil-water contact (OWC) (514). The OWC (514), or gas-oil contact, is the lowest elevation at which mobile hydrocarbons occur. There is then a zone of capillary-bound water (516), which is the zone from the FWL (512) to the OWC (514). Capillary-bound water is water in pore space that does not flow under normal reservoir conditions (unless the rock wettability is altered). In some embodiments, water saturation may be calculated using information from various data sources including resistivity logs, capillary pressure saturation tests, or core plug analysis from interpreted facies. Capillary pressure curves may be used to describe the behavior of matrix rocks.

Capillary pressure ($P_c$) refers to the pressure difference existing across an interface between two immiscible fluids. For example, in a hydrocarbon reservoir, capillary pressure works against the interfacial tension between oil and water and is the force required to squeeze a hydrocarbon droplet through a pore throat. Resistivity logs may be used to calculate water saturation by modeling the relation of water saturation to porosity, connate-water resistivity, and various rock electrical properties. Capillary pressure saturation tests done in a laboratory may be obtained by a variety of laboratory experiments on core plugs measuring the drainage $P_c$ curve. Factors such as porosity, permeability, or pore structure may influence the shape of the $P_c$ curve for a particular interpreted facies. Further, the interpreted facies may be characterized by a range of porosity or permeability values, or pore structure may vary throughout the interpreted facies, meaning various $P_c$ curves may be determined from one particular facies.

FIG. 5B shows an example of capillary pressure in accordance with one or more embodiments. Specifically, FIG. 5B shows an example of a drainage capillary pressure curve. As in FIG. 5A, the horizontal axis (506) in FIG. 5B denotes increasing water saturation. The vertical axis (522) represents increasing height above zero capillary pressure, measured in pounds per square inch (PSI), starting from 0. A drainage capillary pressure curve (518) may be derived through experiments performed on rock samples in a laboratory. The entry pressure (520) and shape of the $P_c$ curve (518) will vary with each rock sample. The irreducible water saturation, $S_{wirr}$ (510), is indicated on the horizontal axis (506) in FIG. 5B, showing the relationship between the $P_c$ curve (518) in FIG. 5B and the saturation curve (502) in FIG. 5A.

Capillary pressure curves measured on rock material for each classified facies within a reservoir may be used to generate a saturation height function (SHF) for that reservoir. In some embodiments, capillary pressure curves may be grouped by facies type and are corrected from laboratory conditions to represent in-situ reservoir conditions. Depending on how the capillary pressure curves are generated, various methods and equations for generating SHFs from interpreted facies are known in the art, including machine-learning methods. The primary factors for generating an SHF are typically rock parameters (such as a facies interpretation), porosity, permeability, (among others) and the height above the free water level. In further embodiments, an SHF may be used to determine a value of water saturation over a given depth interval of a reservoir. Additionally, water saturation may be related to porosity information over a given depth interval within the reservoir to predict the hydrocarbon pore volume for that depth interval.

The hydrocarbon pore volume (HcPV) of a rock in 3D is the capacity of the rock available to store hydrocarbons. In some embodiments, HcPV may be defined by the following equation:

$$\mathrm{HcPV}=V\varnothing(1-s_w) \qquad \text{Equation (2)}$$

where V is the net volume, Ø is the average porosity, $s_w$ is the average water saturation, and its complement $(1-s_w)$ is the average hydrocarbon saturation. In Equation (2), the net volume, V, is a function the bulk rock volume and the net-to-gross ratio. The net-to-gross ratio is the fraction of the bulk rock volume in which oil is found. In some embodiments, Equation (2) may be used to estimate the "original oil in place" (OOIP) or "original gas in place" (OGIP). The OOIP or OGIP may be useful in reserves estimation and refers to the total volume of hydrocarbon stored in a reservoir prior to production. Hydrocarbon reserve estimation is typically a complex process that may involve methods that integrate geological, petrophysical, and engineering data. In 1D, the V can be substituted with a value of height in the reservoir.

As the measurements made by the NMR tool are a direct representation of the subsurface at reservoir conditions, NMR well log data may be used to calculate the HcPV from downhole measurements. In some embodiments, parameters such as pore distribution information from NMR well logs or the FFI (either measured or interpreted), may be used to generate a measured HcPV.

Figure 6:
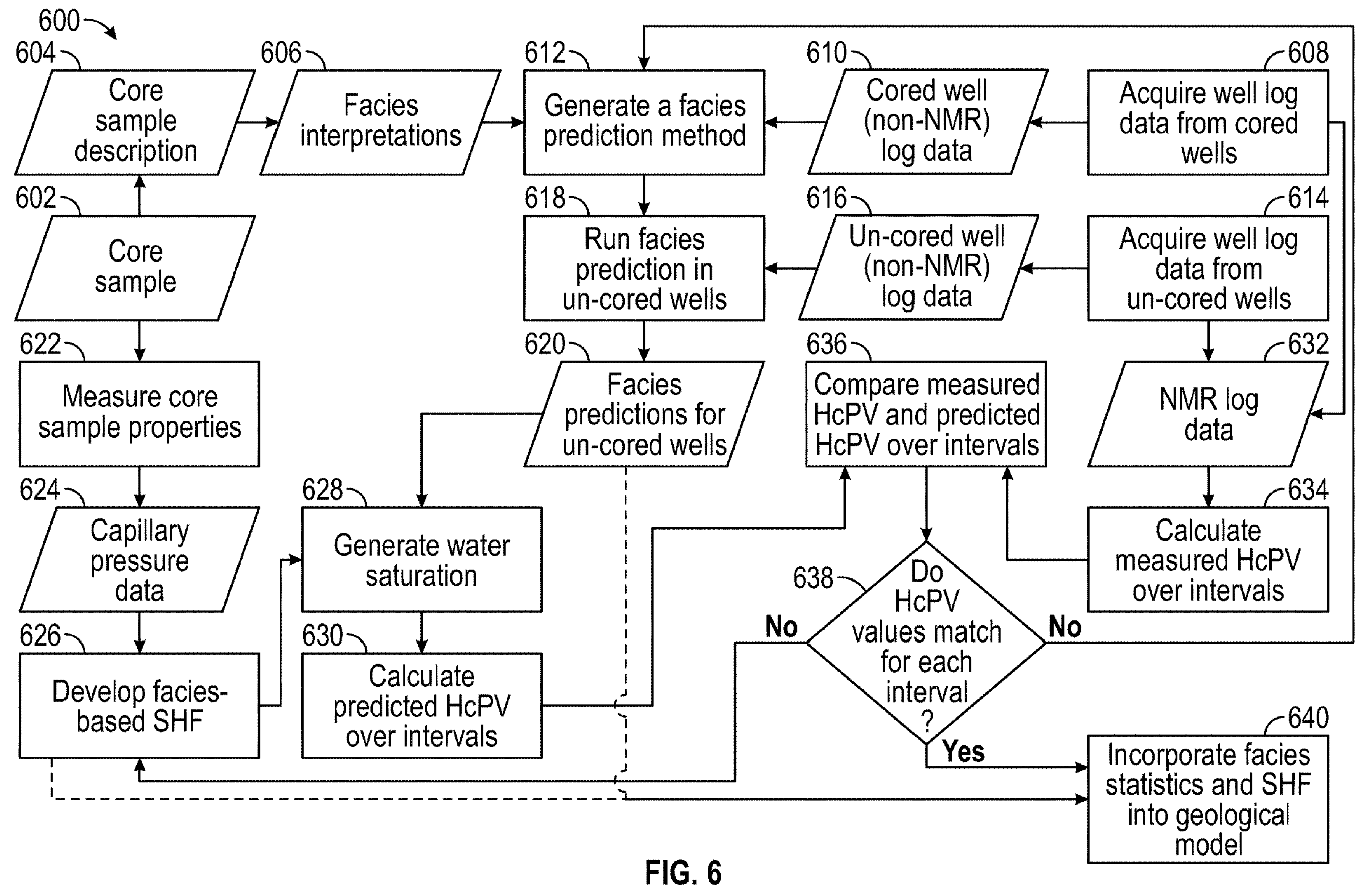
FIG. 6 shows a flowchart in accordance with one or more embodiments.

FIG. 6 shows a flowchart (600) in accordance with one or more embodiments. The flowchart (600) shows an example of a method that evaluates the effectiveness of a facies prediction. A core sample (602) may be used to generate a core sample description (604); that is, a geologist may describe the core sample. The core sample description (604) may be a function of the location within the reservoir from where the core was sampled, and rock type (e.g., carbonate or clastic).

Facies interpretations (606) may be generated from the core sample descriptions (604). Facies interpretations may be determined by visual analysis of a core sample (core sample description). Typically, a core sample may be assigned to one of a small number of discrete facies categories, for example there may be 6 or 8 facies used in the analysis of a single wellbore. The facies determined for a plurality of core samples taken from wellbore may be used to generate a facies log describing the facies encountered by the wellbore along a portion of the length of the wellbore. Facies interpretations (606) from cored wells can be correlated with well logs from those same wells, and these relationships are then used to predict facies in un-cored wells.

In step 608, well logs may be acquired from cored wells, which may include a density log, a porosity log, or an NMR log. A subset of the cored well logs (excluding NMR logs) (610) may be selected and passed to step 612. In step 612, the cored well logs (610) and the facies interpretations (606) may be analyzed together. The analysis, typically performed on a computer, may utilize machine-learning in order to find relationships between well logs and facies interpretations, generating a facies prediction method (step 612). The facies prediction method, which may be used to predict facies in un-cored wells, requires well log input from these un-cored wells.

In step 614, well logs, including NMR logs, are acquired (analogous to step 608) in un-cored wells. The un-cored well logs (excluding NMR logs) (616) may be used as input to the facies prediction method.

In step 618, the facies prediction method generates facies predictions for un-cored wells (620). The validation of these predicted facies, (i.e., the robustness of the facies prediction method) is important, as facies predictions (1D facies models) provide facies statistics for developing or updating a 3D geological model.

In step 622, core sample properties are measured from core samples (602). Experiments done in a laboratory may generate capillary pressure data (624), which provide a relationship between pressure and core sample saturation. In step 626, capillary pressure data may be analyzed and used to develop a facies-based (or other rock character) SHF. In step 628, the facies-based SHF may be related to facies information from the facies predictions for un-cored wells (620), to generate water (or oil) saturation using the SHF across intervals within the reservoir. In step 630, the predicted HcPV may be calculated in 1D, over the intervals.

In step 634, the measured HcPV is computed in 1D across the intervals, using NMR log data (632) from the well logs acquired in steps 608 and 614. In step 636, the measured HcPV and predicted HcPV are compared, where a large enough mis-match may indicate an issue with the predicted HcPV. In step 638, the difference (or delta) between the measured HcPV and predicted HcPV is determined and analyzed for each interval.

If the delta for a given interval is larger than a predetermined threshold, the predicted HcPV should be recalculated for the interval. That is, the variables used to compute the predicted HcPV may be updated (e.g., the SHF or the facies prediction method). Analysis of the SHF and capillary pressure information within the large delta interval may indicate the SHF should be re-developed (back to step 626). Similarly, the facies prediction method (from step 612) may need to be adjusted to generate a new facies prediction that reduces the large delta interval. Otherwise, if the deltas for all intervals are sufficiently small, the facies prediction for un-cored wells (620) and SHF are considered validated and their information may be incorporated into the 3D geological model (step 640).

Figure 7:
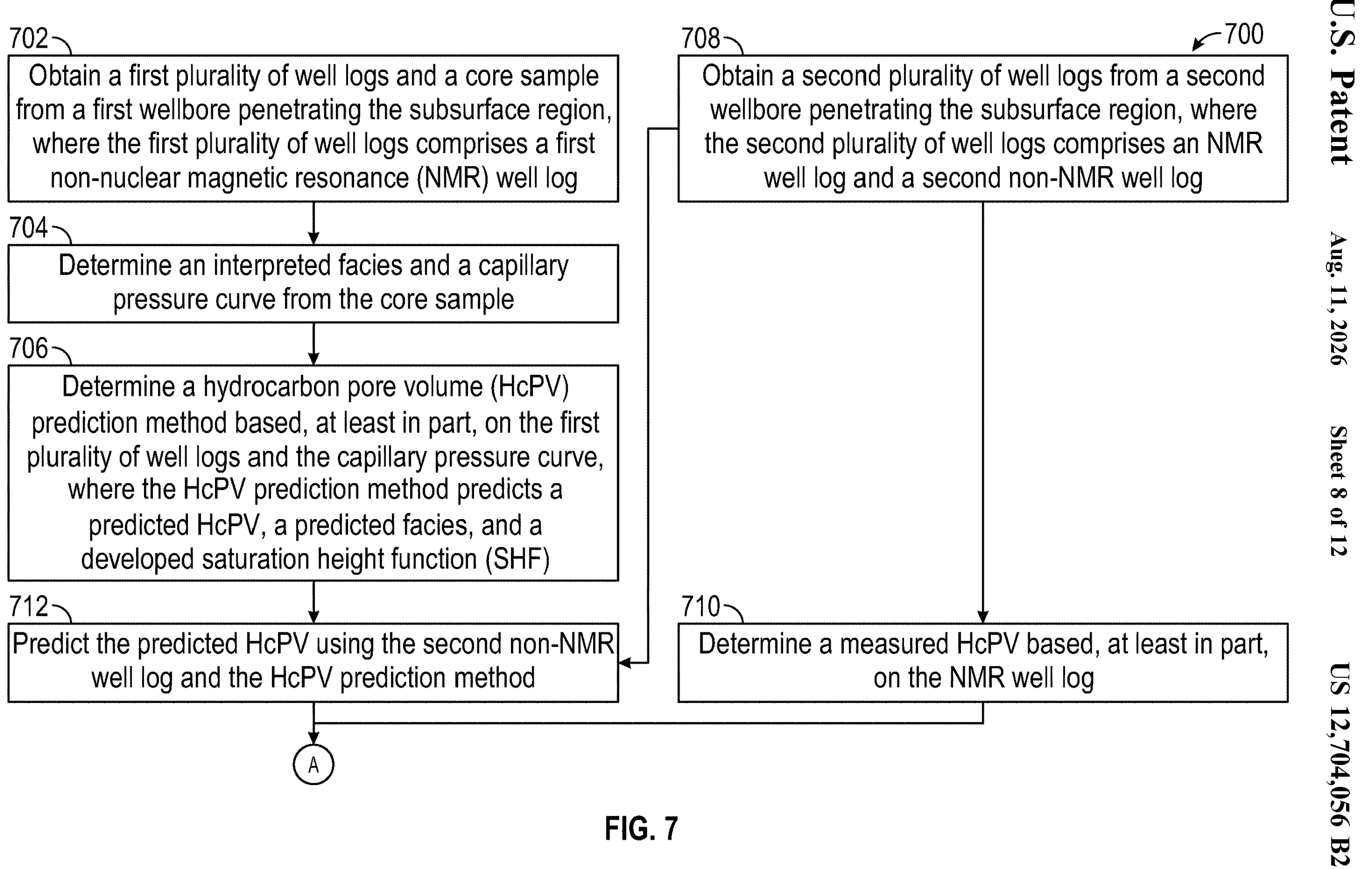
FIG. 7 shows a flowchart in accordance with one or more embodiments.
Figure 7:
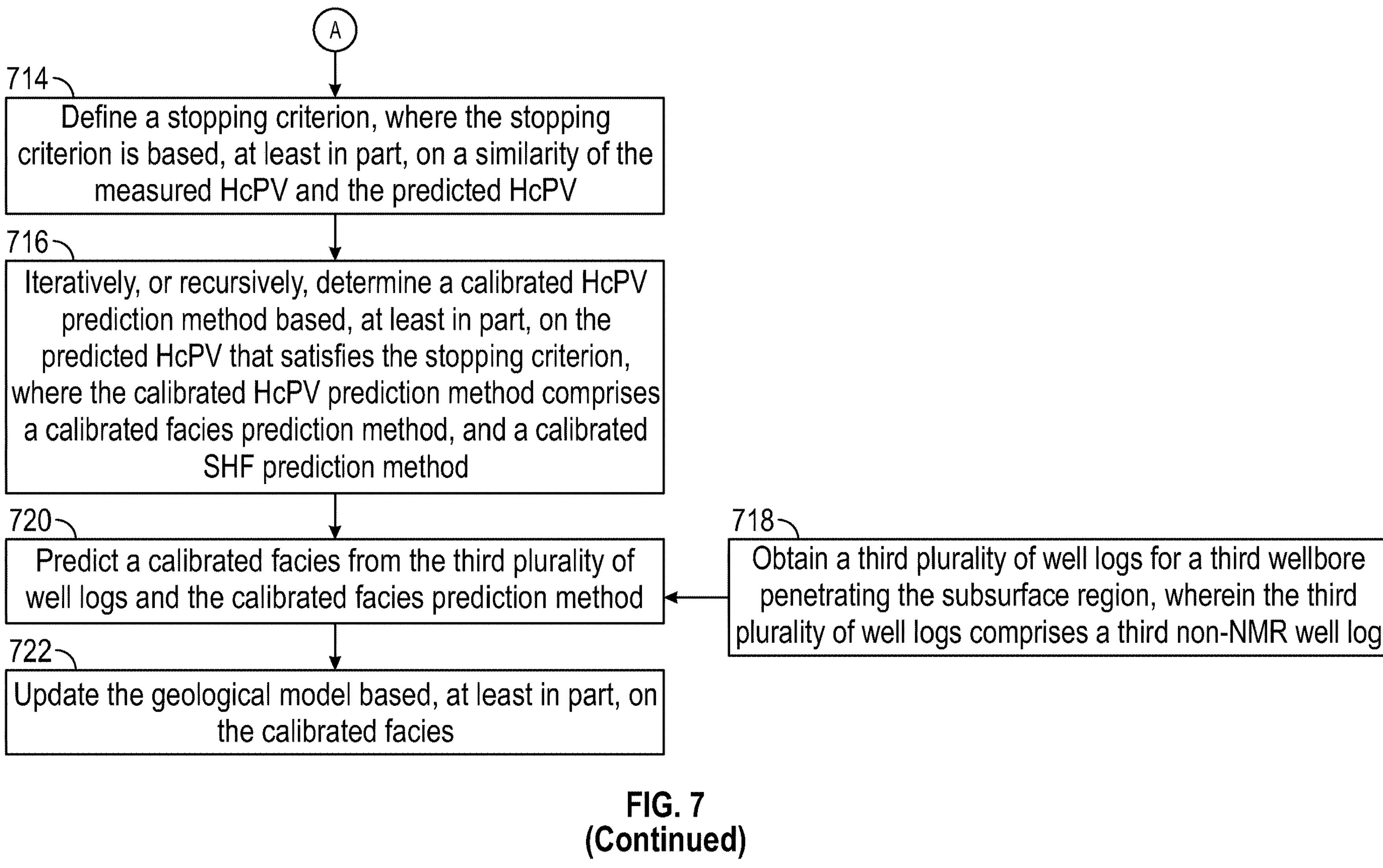

FIG. 7 shows a flowchart (700) of a method for updating a geological model of a subsurface region, in accordance with one or more embodiments. In Step 702 of the flowchart (700), a first plurality of well logs and a core sample from a first wellbore penetrating the subsurface region is obtained. The first plurality of well logs may comprise a first NMR well log such as a resistivity log, gamma ray log, or neutron-density porosity log. In some embodiments, the first plurality of well logs may be processed or calibrated.

In Step 704, an interpreted facies and a capillary pressure curve are determined from the core sample in Step 702, in accordance with one or more embodiments. The interpreted facies may indicate the number and/or location of facies within the first wellbore. The capillary pressure curve may be determined using the interpreted facies by any method known to one ordinarily skilled in the art.

In Step 706, in accordance with one or more embodiments, an HcPV prediction method is determined based, at least in part, on the first plurality of well logs and the capillary pressure curve. The HcPV prediction method may predict a predicted HcPV, a predicted facies, and a developed SHF. That is, the HcPV prediction method may include a facies prediction method and an SHF prediction method. The predicted facies may be predicted using the facies prediction method determined based, at least in part, on the interpreted facies and the first non-NMR well log. Additionally, the developed SHF may be predicted using the SHF prediction method based, at least in part, on the predicted facies and the capillary pressure curve.

In some embodiments, the HcPV prediction method may be a machine learning prediction method that may include classification, clustering, regression or neural networks. The machine learning network may be trained using relationships between the first plurality of well logs and the capillary pressure curve or interpreted facies. In further embodiments, the machine learning method may include gaussian spectral porosity analysis and porosity partitioning using software known to one ordinarily skilled in the art.

In Step 708, a second plurality of well logs from a second wellbore penetrating the subsurface region is obtained, in accordance with one or more embodiments. The second plurality of well logs may comprise an NMR well log and a second non-NMR well log. Examples of a non-NMR well log may include a resistivity log, gamma ray log, or neutron-density porosity log. In some embodiments, the second plurality of well logs may be processed or calibrated.

In Step 710, in accordance with one or more embodiments, a measured HcPV is determined, based, at least in part, on the NMR well log. The measured HcPV may be determined across a depth range of the second wellbore and determined for each of a particular depth interval. For example, the depth interval may a one- or two-foot increment. Further, the NMR log may be calibrated or interpreted. For example, the NMR log may use a single T2 cut-off value for the entire dataset. Or, in order to accurately determine pore size distributions at different depths, the log may be calibrated by applying a T2 cut-off at various sections of the log. In some embodiments, NMR log information such as a T2 signal amplitude may determine porosity, while a T2 cut-off may be used to determine bound fluid measurements or irreducible water saturation.

In Step 712, in accordance with one or more embodiments, a predicted HcPV is predicted using the second non-NMR well log from Step 708 and the HcPV prediction method from Step 706. The predicted HcPV may be predicted for the second wellbore across the same depth range and depth interval as the measured HcPV. In some embodiments, the predicted HcPV may be determined by volumetric estimate, combining rock properties derived from the predicted facies such as porosity and water saturation over a reservoir volume.

In Step 714, in accordance with one or more embodiments, a stopping criterion is defined, where the stopping criterion is based, at least in part, on a similarity of the measured HcPV from Step 710 and the predicted HcPV from Step 712, where the measured HcPV and the predicted HcPV span a common depth range of the second wellbore.

In Step 716, in accordance with one or more embodiments, a calibrated HcPV prediction method is determined, iteratively or recursively, based, at least in part, on the predicted HcPV that satisfied the stopping criterion. The calibrated HcPV prediction method may include a calibrated facies prediction method, and a calibrated SHF prediction method.

Figure 8:
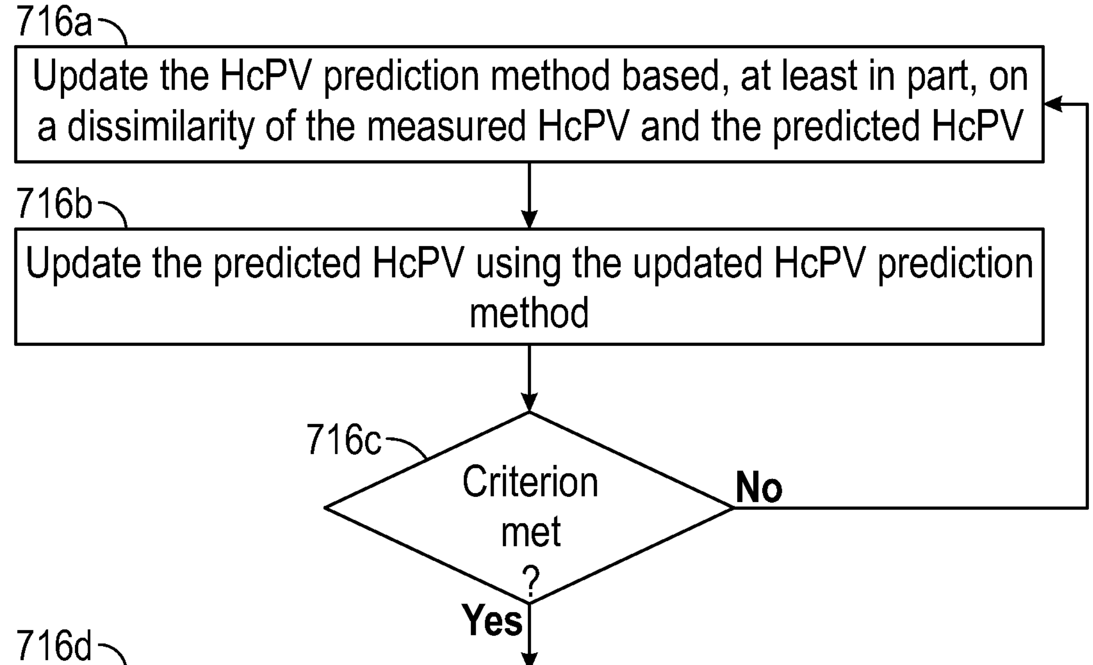
FIG. 8 shows a flowchart in accordance with one or more embodiments.
Figure 8:
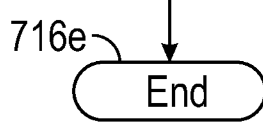

Shifting to flowchart (800) from FIG. 8, in Step 716*a*, in accordance with one or more embodiments, the HcPV prediction method is updated based, at least in part, on a dissimilarity of the measured HcPV and the predicted HcPV. In some embodiments, the HcPV prediction method may be updated by adjusting at least one of: the SHF parameters, the predicted facies, or the capillary pressure curve groupings. In other embodiments, the HcPV prediction method may be updated by adjusting the original facies definitions and therefore inherently, the facies prediction method. These adjustments may be targeted based on a particular depth interval exhibiting the large magnitude of dissimilarity between the measured HcPV and the predicted HcPV. Further, the depth interval used in the determinations of the measured HcPV and predicted HcPV may be reduced or increased to decrease or increase the resolution of the targeted depth interval, respectively.

In Step 716*b*, the predicted HcPV is updated using the updated HcPV prediction method from Step 716*a*, in accordance with one or more embodiments. In other words, the predicted HcPV may be updated using adjusted inputs such as interpreted facies or capillary pressure curves, or by adjusting the method itself. In other embodiments, a machine-learning method may be re-trained using an updated training dataset or updated hyper-parameters.

In Step 716*c*, in accordance with one or more embodiments, a conditional test may be performed, based on the stopping criterion described in Step 714. The stopping criterion may include a value of an objective function. For example, the objective function may be the difference between the measured HcPV and the predicted HcPV, and the stopping criterion may be a user-specified maximum value.

If the stopping criterion in Step 716*c* is not met, the process returns to Step 716*a* to begin another iteration, where the HcPV prediction method is updated. Otherwise, the process continues to Step 716*d*, where a calibrated HcPV prediction method is determined based, at least in part, on the predicted HcPV from Step 716*b*. In some embodiments, the calibrated HcPV prediction method may include a calibrated facies prediction method and a calibrated SHF prediction method. Once the calibrated HcPV prediction method is determined, the loop ends (716*e*) and continues to Step 718 of flowchart (700).

Returning to FIG. 7, in Step 718, a third plurality of well logs for a third wellbore penetrating the subsurface region is obtained, in accordance with one or more embodiments. The third plurality of well logs may comprise a third non-NMR well log such as a resistivity log, a gamma ray log, or a neutron-density porosity log. In some embodiments, the third plurality of well logs may be processed or calibrated.

In Step 720, a calibrated facies is predicted using the third plurality of well logs and the calibrated facies prediction method from Step 716, in accordance with one or more embodiments. A calibrated SHF may also be predicted using the third plurality of well logs and the calibrated SHF prediction method.

In Step 722, in accordance with one or more embodiments, a geological model (170) is updated based, at least in part, on the calibrated facies. In some embodiments, the geological model (170) may also be updated using the calibrated SHF. Facies statistics from calibrated facies and SHF may be incorporated into the geological model. Other typical inputs to geological models may include surface data, geophysical (seismic) survey data, or flow data. An adequate sampling of calibrated facies within a subsurface region may be used to create the structural framework of the geological model. The structural framework may include the spatial positions of major formation boundaries, horizons, faults, or unconformities. Each grid cell (261) in the geological model is assigned a rock type and geostatistical techniques may be used to populate the grid cells with porosity, permeability, or oil saturation (i.e., from the SHF) values appropriate for the given rock type.

In some embodiments, depending on the sampling and resolution of input information available to the geological model, the information may be interpolated to fit the defined grid cell size using geostatistical techniques. The geological model, or "reservoir model" may be used to determine the location and three-dimensional extents of a hydrocarbon reservoir.

The geological model (170) may be used, together with other available information, such as reservoir simulation, to determine the location of a hydrocarbon reservoir within a subterranean region with a high degree of certainty. Further, the geological model, which is a static model, in conjunction with a reservoir simulation, may be used to create a dynamic model that may be used to determine locations within a hydrocarbon reservoir for which wellbores may be drilled, safely and economically, to produce the hydrocarbons. That is, a reservoir simulation may be performed based, at least in part, on the geological model (170).

The reservoir simulation may be used to predict fluid flow (e.g. hydrocarbon recovery) in under one or more producing schemes. The grid cells within the geological model may be represented in numerical form so that a mathematical model may be defined based on fluid and rock properties within the reservoir, and physical laws that govern fluid flow and transport. The mathematical model may be used to calculate pressure, saturation, permeability and porosity changes due to matrix shrinkage, well-to-well interference, or operating procedures given different production scenarios. The examination of various recovery scenarios may be used in the selection of optimal hydrocarbon production parameters, such as designing effective well completions or determining new drilling targets.

In some embodiments, a drilling target may be determined based, at least in part, on the reservoir simulation. An advantageous location to penetrate the hydrocarbon reservoir may be determined through reservoir simulation by estimating the fluid flow within the reservoir given various drilling target scenarios, or by any other method known to one ordinarily skilled in the art. For example, it may be desirable to penetrate the reservoir at a location where the reservoir simulation predicts the hydrocarbon to be undrained. In some embodiments, the reservoir may include a single drilling target for which a tolerance is determined. In other embodiments, it may be necessary for the wellbore to penetrate multiple targets within the hydrocarbon reservoir. For example, a horizontal wellbore including multilateral wellbores may be required for low permeability reservoirs or thin reservoirs such as coal bed methane reservoirs. The reservoir simulation may also be used in wellbore path planning before drilling.

Figure 9:
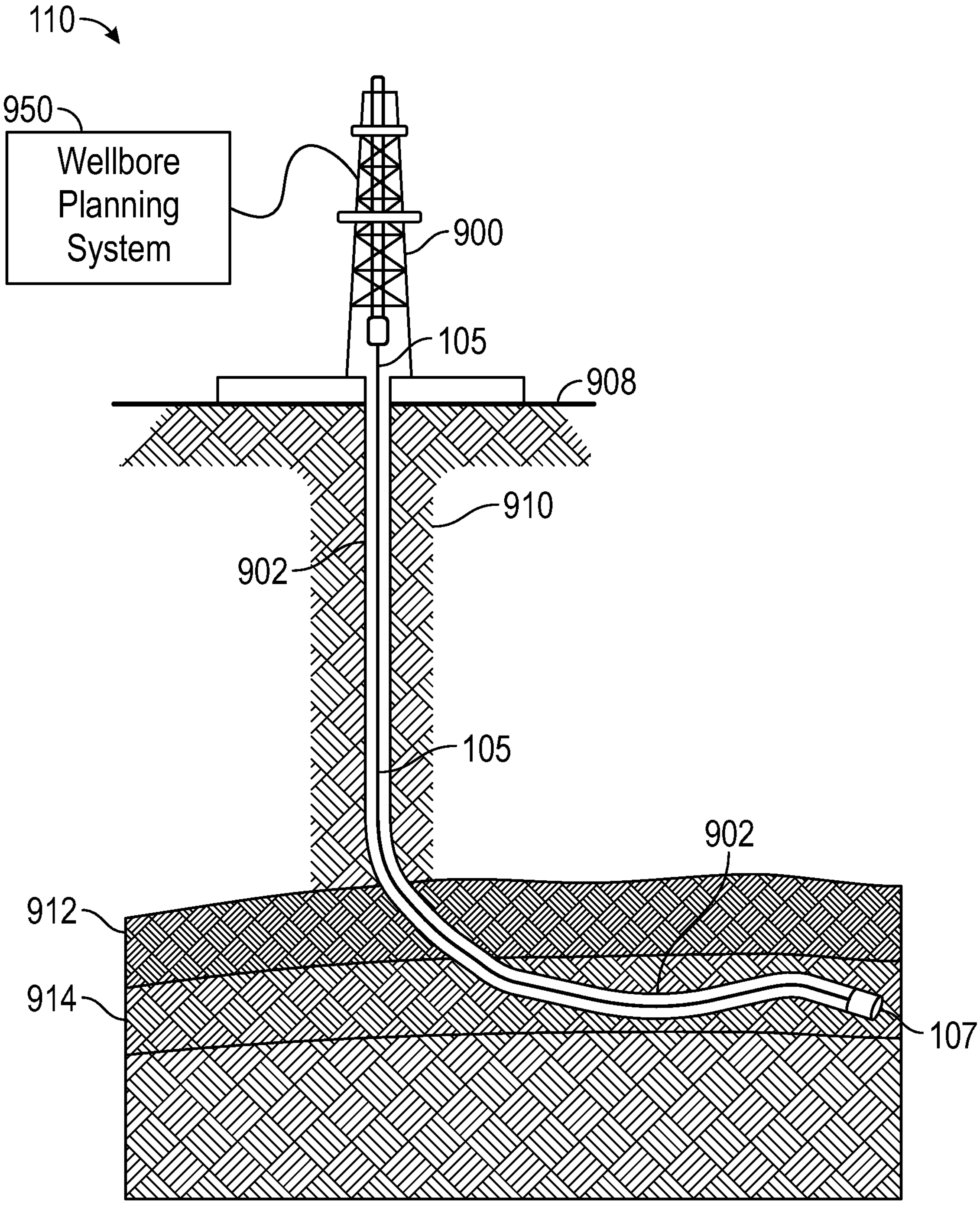
FIG. 9 depicts a drilling system in accordance with one or more embodiments.

FIG. 9 depicts a drilling system (110) in accordance with one or more embodiments. As shown in FIG. 9 a well path (902) may be drilled by a drill bit (107) attached by a drillstring (105) to a drill rig (900) located on the surface of the Earth (908). The well may traverse a plurality of overburden layers (910) and one or more cap-rock layers (912) to a hydrocarbon reservoir (914). In accordance with one or more embodiments, the geological model (170) may be used to plan and drill a well path (902). The well path (902) may be a vertical or horizontal well path, or inclined well path.

Prior to the commencement of drilling, a wellbore plan may be generated. The wellbore plan may include a starting surface location of the wellbore, or a subsurface location within an existing wellbore, from which the wellbore may be drilled. Further, the wellbore plan may include a terminal location that may intersect with the targeted hydrocarbon bearing formation and a planned wellbore path from the starting location to the terminal location. That is, in some embodiments, a wellbore path may be planned, using a wellbore planning system (950), to intersect the drilling target within the subsurface region.

Typically, the wellbore plan is generated based on best available information from a geophysical model, geomechanical models encapsulating subterranean stress conditions, the trajectory of any existing wellbores (which it may be desirable to avoid), and the existence of other drilling hazards, such as shallow gas pockets, over-pressure zones, and active fault planes or cavities. Furthermore, the wellbore plan may take into account other engineering constraints such as the maximum wellbore curvature ("dog-log") that the drillstring may tolerate and the maximum torque and drag values that the drilling system (110) may tolerate.

A wellbore planning system (950) may be used to generate the wellbore plan. The wellbore planning system (950) may comprise one or more computer processors in communication with computer memory containing the geophysical and geomechanical models, information relating to drilling hazards, and the constraints imposed by the limitations of the drillstring and the drilling system (110). The wellbore planning system (950) may further include dedicated software to determine the planned wellbore path and associated drilling parameters, such as the planned wellbore diameter, the location of planned changes of the wellbore diameter, the planned depths at which casing will be inserted to support the wellbore and to prevent formation fluids entering the wellbore, and the drilling mud weights (densities) and types that may be used during drilling the wellbore.

Turning back to FIG. 9, a wellbore may be drilled, guided by the planned wellbore path, using a drill rig (900) that may be situated on a land drill site, an offshore platform, such as a jack-up rig, a semi-submersible, or a drill ship. The drill rig (900) may be equipped with a hoisting system, which can raise or lower the drillstring and other tools required to drill the well. The drillstring (105) may include one or more drill pipes connected to form conduit and a bottom hole assembly (BHA) disposed at the distal end of the drillstring. The BHA may include a drill bit (107) to cut into subsurface rock. The BHA may further include measurement tools, such as a measurement-while-drilling (MWD) tool and logging-while-drilling (LWD) tool. MWD tools may include sensors and hardware to measure downhole drilling parameters, such as the azimuth and inclination of the drill bit, the weight-on-bit, and the torque. The LWD measurements may include sensors, such as resistivity, gamma ray, and neutron/density sensors, to characterize the rock formation surrounding the wellbore. Both MWD and LWD measurements may be transmitted to the surface using any suitable telemetry system, such as mud-pulse telemetry.

To start drilling, or "spudding in" the well, the hoisting system lowers the drillstring suspended from the drill rig towards the planned surface location of the wellbore. An engine, such as a diesel engine, may be used to rotate the drillstring. The weight of the drillstring combined with the rotational motion enables the drill bit (107) to bore the wellbore.

The near-surface is typically made up of loose or soft sediment or rock, so large diameter casing, e.g. "base pipe" or "conductor casing," is often put in place while drilling to stabilize and isolate the wellbore. At the top of the base pipe is the wellhead, which serves to provide pressure control through a series of spools, valves, or adapters. Once near-surface drilling has begun, water or drill fluid may be used to force the base pipe into place using a pumping system until the wellhead is situated just above the surface of the earth.

Drilling may continue without any casing once deeper more compact rock is reached. While drilling, drilling mud may be injected from the surface through the drill pipe using the mud circulation system (109). Drilling mud serves various purposes, including pressure equalization, removal of rock cuttings, or drill bit cooling and lubrication. At planned depth intervals, drilling may be paused and the drillstring withdrawn from the wellbore. Sections of casing may be connected and inserted and cemented into the wellbore. Casing string may be cemented in place by pumping cement and mud, separated by a "cementing plug," from the surface through the drill pipe. The cementing plug and drilling mud force the cement through the drill pipe and into the annular space between the casing and the wellbore wall. Once the cement cures drilling may recommence. The drilling process is often performed in several stages. Therefore, the drilling and casing cycle may be repeated more than once, depending on the depth of the wellbore and the pressure on the wellbore walls from surrounding rock. Due to the high pressures experienced by deep wellbores, a blowout preventer (BOP) may be installed at the wellhead to protect the rig and environment from unplanned oil or gas releases. As the wellbore becomes deeper, both successively smaller drill bits and casing string may be used. Drilling deviated or horizontal wellbores may require specialized drill bits or drill assemblies.

A drilling system (110) may be disposed at and communicate with the well site (100). The drilling system (110) may control at least a portion of a drilling operation at the well site (100) by providing controls to various components of the drilling operation. In one or more embodiments, the system may receive data from one or more sensors arranged to measure controllable parameters of the drilling operation. As a non-limiting example, sensors may be arranged to measure WOB (weight on bit), RPM (drill rotational speed), GPM (flow rate of the mud pumps), and ROP (rate of penetration of the drilling operation). Each sensor may be positioned or configured to measure a desired physical stimulus. Drilling may be considered complete when a target zone is reached, or the presence of hydrocarbons is established.

Figures 10, 11:
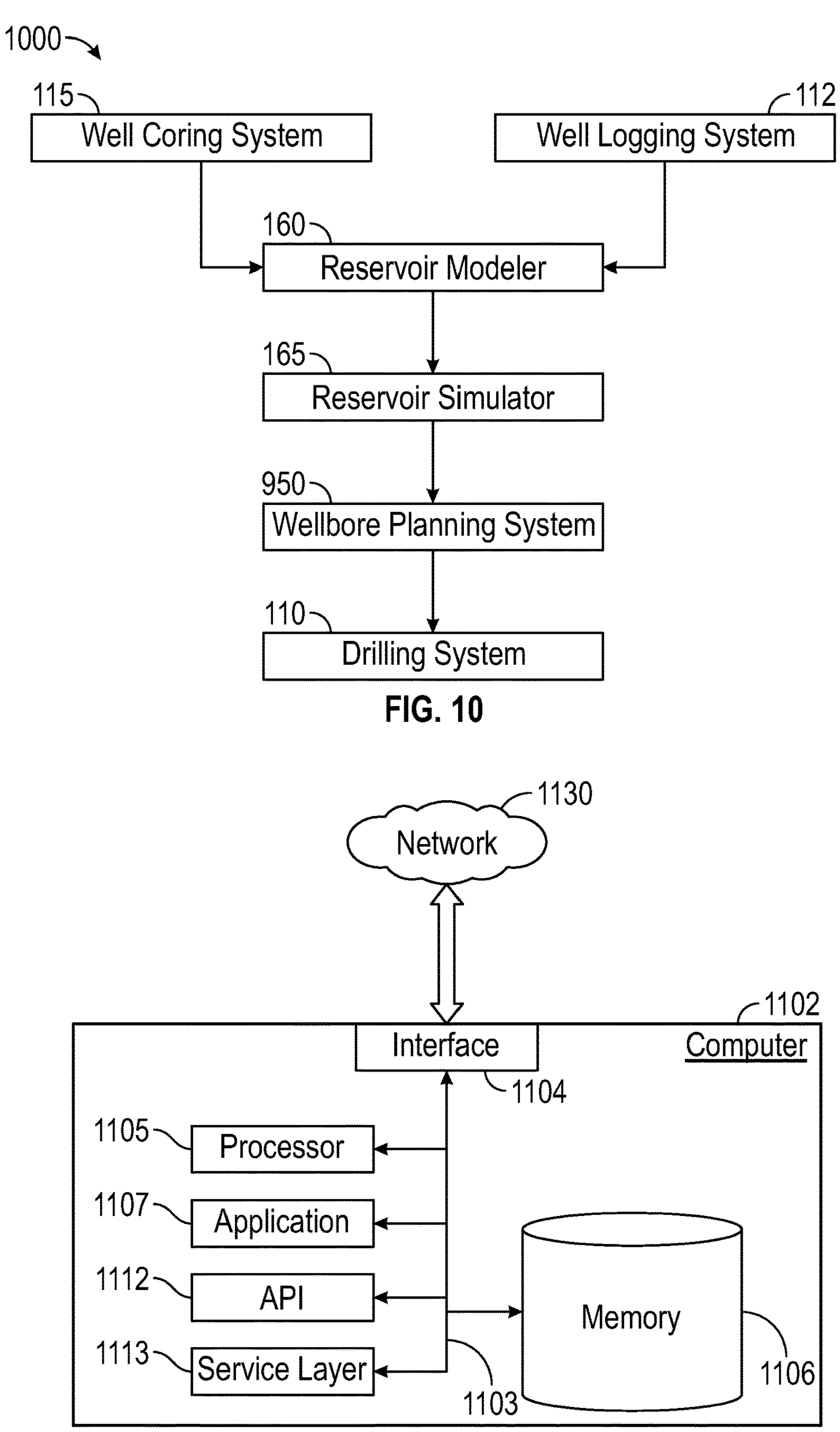
FIG. 10 shows a block diagram of systems in accordance with one or more embodiments.
FIG. 11 depicts a block diagram of a computer system in accordance with one or more embodiments.

FIG. 10 shows a block diagram of systems (1000) in accordance with one or more embodiments. Each system may be coupled to one or more other systems within the series of systems (1000). The well logging system (112) may be configured to record a plurality of well logs from a wellbore (104), as described in FIG. 1. The well coring system (115) may extract a core sample from a wellbore, also described in FIG. 1. The extracted core sample and recorded well logs may analyzed and/or interpreted by those ordinarily skilled in the art to produce rock or facies statistics for use in a geological model. Information from a geological model, or information from well logs and/or core samples may be transferred to a reservoir modeler (160).

The reservoir modeler (160) may receive a pre-defined geological model of a subterranean region or information from well logs and/or core samples to update or produce an independent geological model. A static model comprising the end product of the completed geological model, may be transferred to a reservoir simulator (165) where a dynamic model may be generated to locate a hydrocarbon reservoir and corresponding drilling target.

Knowledge of a location of a drilling target, hydrocarbon reservoir, and other subterranean features may be transferred to a wellbore planning system (950). The wellbore planning system (950) may use this information to plan a wellbore path from the surface (908) of the earth to intersect the drilling target.

Information regarding the planned wellbore path may be transferred to the drilling system (110) described in FIG. 9. The drilling system (110) may drill the wellbore along the planned wellbore path to access and produce the hydrocarbon reservoir.

Systems such as the well coring system (115), the well logging system (112), the reservoir modeler (160), the reservoir simulator (165), the wellbore planning system (950), and the drilling system (110) may all include or be implemented on one or more computer systems such as the one shown in FIG. 11.

FIG. 11 depicts a block diagram of a computer system used to provide computational functionalities associated with described algorithms, methods, functions, processes, flows, and procedures as described in this disclosure, according to one or more embodiments. The illustrated computer (1102) is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (1102) may include a computer that includes an input device, such as a keypad, keyboard, touch screen, or other device that can accept user information, and an output device that conveys information associated with the operation of the computer (1102), including digital data, visual, or audio information (or a combination of information), or a GUI.

The computer (1102) can serve in a role as a client, network component, a server, a database or other persistency, or any other component (or a combination of roles) of a computer system for performing the subject matter described in the instant disclosure. The illustrated computer (1102) is communicably coupled with a network (1130). In some implementations, one or more components of the computer (1102) may be configured to operate within environments, including cloud-computing-based, local, global, or other environment (or a combination of environments).

At a high level, the computer (1102) is an electronic computing device operable to receive, transmit, process, store, or manage data and information associated with the described subject matter. According to some implementations, the computer (1102) may also include or be communicably coupled with an application server, e-mail server, web server, caching server, streaming data server, business intelligence (BI) server, or other server (or a combination of servers).

The computer (1102) can receive requests over network (1130) from a client application (for example, executing on another computer (1102) and responding to the received requests by processing the said requests in an appropriate software application. In addition, requests may also be sent to the computer (1102) from internal users (for example, from a command console or by other appropriate access method), external or third-parties, other automated applications, as well as any other appropriate entities, individuals, systems, or computers.

Each of the components of the computer (1102) can communicate using a system bus (1103). In some implementations, any or all of the components of the computer (1102), both hardware or software (or a combination of hardware and software), may interface with each other or the interface (1104) (or a combination of both) over the system bus (1103) using an application programming interface (API) (1112) or a service layer (1113) (or a combination of the API (1112) and service layer (1113). The API (1112) may include specifications for routines, data structures, and object classes. The API (1112) may be either computer-language independent or dependent and refer to a complete interface, a single function, or even a set of APIs. The service layer (1113) provides software services to the computer (1102) or other components (whether or not illustrated) that are communicably coupled to the computer (1102). The functionality of the computer (1102) may be accessible for all service consumers using this service layer. Software services, such as those provided by the service layer (1113), provide reusable, defined business functionalities through a defined interface. For example, the interface may be software written in JAVA, C++, or other suitable language providing data in extensible markup language (XML) format or another suitable format. While illustrated as an integrated component of the computer (1102), alternative implementations may illustrate the API (1112) or the service layer (1113) as stand-alone components in relation to other components of the computer (1102) or other components (whether or not illustrated) that are communicably coupled to the computer (1102). Moreover, any or all parts of the API (1112) or the service layer (1113) may be implemented as child or sub-modules of another software module, enterprise application, or hardware module without departing from the scope of this disclosure.

The computer (1102) includes an interface (1104). Although illustrated as a single interface (1104) in FIG. 11, two or more interfaces (1104) may be used according to particular needs, desires, or particular implementations of the computer (1102). The interface (1104) is used by the computer (1102) for communicating with other systems in a distributed environment that are connected to the network (1130). Generally, the interface (1104) includes logic encoded in software or hardware (or a combination of software and hardware) and operable to communicate with the network (1130). More specifically, the interface (1104) may include software supporting one or more communication protocols associated with communications such that the network (1130) or interface's hardware is operable to communicate physical signals within and outside of the illustrated computer (1102).

The computer (1102) includes at least one computer processor (1105). Although illustrated as a single computer processor (1105) in FIG. 11, two or more processors may be used according to particular needs, desires, or particular implementations of the computer (1102). Generally, the computer processor (1105) executes instructions and manipulates data to perform the operations of the computer (1102) and any algorithms, methods, functions, processes, flows, and procedures as described in the instant disclosure.

The computer (1102) also includes a memory (1106) that holds data for the computer (1102) or other components (or a combination of both) that can be connected to the network (1130). For example, memory (1106) can be a database storing data consistent with this disclosure. Although illustrated as a single memory (1106) in FIG. 11, two or more memories may be used according to particular needs, desires, or particular implementations of the computer (1102) and the described functionality. While memory (1106) is illustrated as an integral component of the computer (1102), in alternative implementations, memory (1106) can be external to the computer (1102).

The application (1107) is an algorithmic software engine providing functionality according to particular needs, desires, or particular implementations of the computer (1102), particularly with respect to functionality described in this disclosure. For example, application (1107) can serve as one or more components, modules, applications, etc. Further, although illustrated as a single application (1107), the application (1107) may be implemented as multiple applications (1107) on the computer (1102). In addition, although illustrated as integral to the computer (1102), in alternative implementations, the application (1107) can be external to the computer (1102).

There may be any number of computers (1102) associated with, or external to, a computer system containing computer (1102), wherein each computer (1102) communicates over network (1130). Further, the term "client," "user," and other appropriate terminology may be used interchangeably as appropriate without departing from the scope of this disclosure. Moreover, this disclosure contemplates that many users may use one computer (1102), or that one user may use multiple computers (1102).

In some embodiments, attribute generation such as Steps 710 and 712 of FIG. 7 may be conducted using a first computer (1102) and one or more first applications (1107) while updating a geological model, such as Step 722 of FIG. 7, may be conducted on a second computer (1102) using one or more second applications (1107).

Although only a few example embodiments have been described in detail above, those skilled in the art will readily appreciate that many modifications are possible in the example embodiments without materially departing from this invention. Accordingly, all such modifications are intended to be included within the scope of this disclosure as limited only by the scope of the following claims.

What is claimed is:

1. A method comprising:

measuring a first set of formation properties across a first depth interval in a first wellbore penetrating a subsurface region, the measuring comprising:

obtaining a first plurality of well logs using at least one logging tool, wherein the first plurality of well logs comprises a first non-nuclear magnetic resonance (NMR) well log; and physically extracting a core sample from the first wellbore and deriving an interpreted facies, a capillary pressure curve, and a saturation height function (SHF) from the core sample, wherein the first set of formation properties comprises the first plurality of well logs, the interpreted facies, the capillary pressure curve, and the SHF;

generating a hydrocarbon pore volume (HcPV) prediction method based, at least in part, on the first set of formation properties, wherein the HcPV prediction method predicts a predicted HcPV, a predicted facies, and a developed SHF;

measuring, across a second depth interval using the at least one logging tool, a second set of formation properties in a second wellbore penetrating the subsurface region by:

obtaining a second plurality of well logs, wherein the second plurality of well logs comprises an NMR well log and a second non-NMR well log, wherein the NMR well log comprises a set of NMR measurements comprising T2 distributions, free fluid index (FFI), and bulk volume irreducible (BVI), wherein the second set of formation properties comprises the second plurality of well logs;

deriving a measured HcPV across the second depth interval based, at least in part, on the set of NMR measurements in the NMR well log;

calculating the predicted HcPV using the second non-NMR well log and the HcPV prediction method;

defining a stopping criterion based, at least in part, on a dissimilarity of the measured HcPV and the predicted HcPV;

calculating a difference between the measured HcPV and the predicted HcPV;

iteratively, or recursively, while the difference exceeds the stopping criterion;

adjusting at least one of: the SHF, the capillary pressure curve, or the interpreted facies;

generating an updated HcPV prediction method using the adjusted first set of formation properties;

re-calculating the predicted HcPV using the second non-NMR well log and the updated HcPV prediction method; and re-calculating the difference between the measured HcPV and the predicted HcPV;

generating a calibrated HcPV prediction method based, at least in part, on the predicted HcPV that satisfies the stopping criterion, wherein the calibrated HcPV prediction method comprises a calibrated facies prediction method and a calibrated SHF prediction method;

measuring, across a targeted depth interval using the at least one logging tool, a third set of formation properties in a third wellbore penetrating the subsurface region by:

obtaining a third plurality of well logs, wherein the third plurality of well logs comprises a third non-NMR well log;

predicting a calibrated facies of the third wellbore at the targeted depth interval using the third plurality of well logs and the calibrated facies prediction method;

updating a geological model based, at least in part, on the calibrated facies;

identifying, using the calibrated facies, an identified drilling target within the subsurface region, wherein the identified drilling target corresponds to an advantageous location to penetrate the subsurface region due to an expected preferred fluid flow amount indicated by the calibrated facies; and drilling, using a wellbore drilling system, a wellbore to intersect the identified drilling target.

2. The method of claim 1, further comprising:

predicting a calibrated SHF using the third plurality of well logs and the calibrated SHF prediction method; and updating the geological model based, at least in part, on the calibrated SHF.

3. The method of claim 1, wherein generating the HcPV prediction method comprises:

determining a facies prediction method based, at least in part, on the interpreted facies and the first non-NMR well log, wherein the facies prediction method generates the predicted facies from non-NMR type well logs;

determining an SHF prediction method based, at least in part, on the predicted facies and the capillary pressure curve; and determining the predicted HcPV based, at least in part, on the developed SHF.

4. The method of claim 1, wherein the stopping criterion comprises a value of an objective function.

5. The method of claim 1, wherein the HcPV prediction method comprises a machine learning method.

6. The method of claim 1, wherein the measured HcPV and the predicted HcPV span a common depth range of the second wellbore.

7. The method of claim 1, further comprising:

performing a reservoir simulation based, at least in part, on the geological model; and determining the identified drilling target within the subsurface region based, at least in part, on the reservoir simulation.

8. The method of claim 7, comprising:

planning, using a wellbore planning system, a wellbore path to intersect the identified drilling target; and drilling, using the wellbore drilling system, the wellbore guided by the planned wellbore path.

9. A non-transitory computer readable medium storing a set of instructions, executable by a computer processor, the set of instructions comprising functionality for:

receiving a first set of formation properties across a first depth interval in a first wellbore penetrating a subsurface region, the first set of formation properties comprising:

a first plurality of well logs measured by at least one logging tool, wherein the first plurality of well logs comprises a first non-nuclear magnetic resonance (NMR) well log; and an interpreted facies, a capillary pressure curve, and a saturation height function (SHF derived from a core sample dataset obtained by physically extracting a core sample from the first wellbore;

generating a hydrocarbon pore volume (HcPV) prediction method based, at least in part, on the first set of formation properties, wherein the HcPV prediction method predicts a predicted HcPV, a predicted facies, and a developed SHF;

receiving a second set of formation properties across a second depth interval in a second wellbore penetrating the subsurface region, the second set of formation properties comprising:

a second plurality of well logs measured by the at least one logging tool, wherein the second plurality of well logs comprises an NMR well log and a second non-NMR well log, wherein the NMR well log comprises a set of NMR measurements comprising T2 distributions, free fluid index (FFI), and bulk volume irreducible (BVI);

deriving a measured HcPV across the second depth interval based, at least in part, on the set of NMR measurements in the NMR well log;

calculating the predicted HcPV using the second non-NMR well log and the HcPV prediction method;

defining a stopping criterion based, at least in part, on a dissimilarity of the measured HcPV and the predicted HcPV;

calculating a difference between the measured HcPV and the predicted HcPV;

iteratively, or recursively, while the difference exceeds the stopping criterion:

adjusting at least one of: the SHF, the capillary pressure curve, or the interpreted facies;

generating an updated HcPV prediction method using the adjusted first set of formation properties;

re-calculating the predicted HcPV using the second non-NMR well log and the updated HcPV prediction method; and re-calculating the difference between the measured HcPV and the predicted HcPV;

generating a calibrated HcPV prediction method based, at least in part, on the predicted HcPV that satisfies the stopping criterion, wherein the calibrated HcPV prediction method comprises a calibrated facies prediction method and a calibrated SHF prediction method;

receiving a third set of formation properties across a targeted depth interval in a third wellbore penetrating the subsurface region, the third set of formation properties comprising:

a third plurality of well logs measured by the at least one logging tool, wherein the third plurality of well logs comprises a third non-NMR well log;

predicting a calibrated facies of the third wellbore at the targeted depth interval using the third plurality of well logs and the calibrated facies prediction method;

updating a geological model based, at least in part, on the calibrated facies;

identifying, using the calibrated facies, an identified drilling target within the subsurface region, wherein the identified drilling target corresponds to an advantageous location to penetrate the subsurface region due to an expected preferred fluid flow amount indicated by the calibrated facies; and outputting control instructions to a wellbore drilling system to control the wellbore drilling system to drill a wellbore that intersects the identified drilling target.

10. The non-transitory computer readable medium of claim 9, further comprising:

predicting a SHF using the third plurality of well logs and the calibrated SHF prediction method; and updating the geological model based, at least in part, on the calibrated SHF.

11. The non-transitory computer readable medium of claim 9, wherein generating the HcPV prediction method comprises:

determining a facies prediction method based, at least in part, on the interpreted facies and the first non-NMR well log, wherein the facies prediction method generates the predicted facies from non-NMR type well logs;

determining an SHF prediction method based, at least in part, on the predicted facies and the capillary pressure curve; and determining the predicted HcPV based, at least in part, on the developed SHF.

12. The non-transitory computer readable medium of claim 9, wherein the stopping criterion comprises a value of an objective function.

13. The non-transitory computer readable medium of claim 9, further comprising:

performing a reservoir simulation based, at least in part, on the geological model; and determining the identified drilling target within the subsurface region based, at least in part, on the reservoir simulation.

14. The non-transitory computer readable medium of claim 13, comprising planning, using a wellbore planning system, a wellbore path to intersect the identified drilling target within the subsurface region.

15. A system comprising:
a well logging system configured to use at least one logging tool to record:
a first plurality of well logs from a first wellbore penetrating a subsurface region, wherein the first plurality of well logs comprises a first non-nuclear magnetic resonance (NMR) well log,
wherein the first plurality of well logs are measured across a first depth interval;
a second plurality of well logs from a second wellbore penetrating the subsurface region, wherein the second plurality of well logs comprises an NMR well log and a second non-NMR well log,
wherein the second plurality of well logs are measured across a second depth interval,
wherein the NMR well log comprises a set of NMR measurements comprising T2 distributions, free fluid index (FFI), and bulk volume irreducible (BVI), and
a third plurality of well logs for a third wellbore penetrating the subsurface region,
wherein the third plurality of well logs comprises a third non-NMR well log,
wherein the third plurality of well logs are measured across a targeted depth interval;
a well coring system equipped to physically extract a core sample from the first wellbore; and
a computer processor configured to:
derive an interpreted facies, a capillary pressure curve, and a saturation height function (SHF) from the core sample,
generate a hydrocarbon pore volume (HcPV) prediction method based, at least in part, on the first plurality of well logs, the interpreted facies, the capillary pressure curve, and the SHF, wherein the HcPV prediction method predicts a predicted HcPV, a predicted facies, and a developed SHF,
derive a measured HcPV across the second depth interval based, at least in part, on the set of NMR measurements in the NMR well log,
calculate the predicted HcPV using the second non-NMR well log and the HcPV prediction method,
define a stopping criterion based, at least in part, on a dissimilarity of the measured HcPV and the predicted HcPV,
calculate a difference between the measured HcPV and the predicted HcPV,
iteratively, or recursively, while the difference exceeds the stopping criterion:
adjust at least one of: the SHF, the capillary pressure curve, or the interpreted facies;
generate an updated HcPV prediction method using the first plurality of well logs, the adjusted interpreted facies, the adjusted capillary pressure curve, and the adjusted SHF;
re-calculate the predicted HcPV using the second non-NMR well log and the updated HcPV prediction method; and
re-calculate the difference between the measured HcPV and the predicted HcPV;
generate a calibrated HcPV prediction method based, at least in part, on the predicted HcPV that satisfies the stopping criterion, wherein the calibrated HcPV prediction method comprises a calibrated facies prediction method and a calibrated SHF prediction method,
predict a calibrated facies at the targeted depth interval using the third plurality of well logs and the calibrated facies prediction method,
update a geological model based, at least in part, on the calibrated facies, and
identify, using the calibrated facies, an identified drilling target within the subsurface region,
wherein the identified drilling target corresponds to an advantageous location to penetrate the subsurface region due to an expected preferred a fluid flow amount indicated by the calibrated facies; and
control a wellbore drilling system to drill a wellbore that intersects the identified drilling target.

16. The system of claim 15, wherein the computer processor is further configured to:
predict a calibrated SHF using the third plurality of well logs and the calibrated SHF prediction method; and
update the geological model based, at least in part, on the calibrated SHF.

17. The system of claim 15, wherein generating the HcPV prediction method comprises:
determining a facies prediction method based, at least in part, on the interpreted facies and the first non-NMR well log, wherein the facies prediction method generates the predicted facies from non-NMR type well logs;
determining an SHF prediction method based, at least in part, on the predicted facies and the capillary pressure curve; and
determining the predicted HcPV based, at least in part, on the developed SHF.

18. The system of claim 15, wherein the stopping criterion comprises a value of an objective function.

19. The system of claim 15, further comprising a reservoir simulator configured to:
perform a reservoir simulation based, at least in part, on the geological model; and
determine the identified drilling target within the subsurface region based, at least in part, on the reservoir simulation.

20. The system of claim 19, comprising:
a wellbore planning system, to plan a wellbore path to intersect the identified drilling target; and
the wellbore drilling system, to drill the wellbore guided by the planned wellbore path.

* * * * *